US012238955B2

(12) United States Patent
Shimatsu

(10) Patent No.: US 12,238,955 B2
(45) Date of Patent: Feb. 25, 2025

(54) DISPLAY DEVICE AND ELECTRONIC APPARATUS

(71) Applicant: Sony Group Corporation, Tokyo (JP)

(72) Inventor: Tomohiko Shimatsu, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 419 days.

(21) Appl. No.: 17/774,654

(22) PCT Filed: Oct. 27, 2020

(86) PCT No.: PCT/JP2020/040243
§ 371 (c)(1),
(2) Date: May 5, 2022

(87) PCT Pub. No.: WO2021/117364
PCT Pub. Date: Jun. 17, 2021

(65) Prior Publication Data
US 2022/0376206 A1 Nov. 24, 2022

(30) Foreign Application Priority Data
Dec. 10, 2019 (JP) ................. 2019-222813

(51) Int. Cl.
*H10K 50/84* (2023.01)
*H10K 50/842* (2023.01)
(52) U.S. Cl.
CPC ................. *H10K 50/8426* (2023.02)
(58) Field of Classification Search
CPC ........... H10K 50/8426; H10K 59/8722; H10K 59/12; G02B 5/20; G09F 9/30; H05B 33/04; H05B 33/12
See application file for complete search history.

(56) References Cited

U.S. PATENT DOCUMENTS

| 2004/0189194 A1* | 9/2004 | Kihara ................. H10K 50/17 313/506 |
| 2007/0222384 A1* | 9/2007 | Yonemoto ............ H10K 50/841 313/506 |
| 2010/0328282 A1* | 12/2010 | Su ......................... H10K 50/84 345/82 |
| 2011/0140599 A1 | 6/2011 | Lee et al. |

(Continued)

FOREIGN PATENT DOCUMENTS

| CN | 209401656 U | * | 9/2019 |
| JP | 2002258261 A | * | 9/2002 |

(Continued)

OTHER PUBLICATIONS

International Search Report (PCT/ISA/210), International Application No. PCT/JP2020/040243, dated Dec. 8, 2020.

*Primary Examiner* — S M Sohel Imtiaz
(74) *Attorney, Agent, or Firm* — Michael Best Friedrich LLP

(57) ABSTRACT

A display device includes: a first substrate including a display area including display elements arranged in a matrix; a second substrate including a transparent material; and a seal portion placed so as to surround a periphery of the display area, wherein the seal portion includes a core including a light shielding material and a covering member including a sealing material, and the first substrate and the second substrate are sealed while a surface of the covering member in the seal portion serves as a contact surface.

20 Claims, 21 Drawing Sheets

(56) References Cited

U.S. PATENT DOCUMENTS

| | | | |
|---|---|---|---|
| 2011/0303943 A1* | 12/2011 | Lee | H10K 50/8426 |
| | | | 438/26 |
| 2014/0125935 A1* | 5/2014 | Nakamura | H10K 50/8426 |
| | | | 438/30 |
| 2014/0132148 A1 | 5/2014 | Jang et al. | |
| 2015/0185539 A1* | 7/2015 | Senokuchi | H10K 59/8722 |
| | | | 257/40 |
| 2015/0236297 A1 | 8/2015 | Hong | |
| 2017/0133627 A1* | 5/2017 | Sato | H10K 50/82 |
| 2017/0261785 A1* | 9/2017 | Nishino | G02F 1/1339 |
| 2017/0285229 A1* | 10/2017 | Yuan | G02F 1/133512 |
| 2018/0159070 A1 | 6/2018 | He | |
| 2018/0182984 A1* | 6/2018 | Lim | H10K 50/846 |
| 2019/0036078 A1* | 1/2019 | Niiyama | H10K 50/846 |
| 2019/0363145 A1* | 11/2019 | Ohta | H05B 33/06 |
| 2020/0409192 A1* | 12/2020 | Makino | G02F 1/1339 |
| 2021/0126057 A1* | 4/2021 | Seo | H10K 59/124 |
| 2021/0367014 A1* | 11/2021 | Hanari | H10K 59/1213 |

FOREIGN PATENT DOCUMENTS

| | | |
|---|---|---|
| JP | 2006245010 A | 9/2006 |
| JP | 2011-258555 A | 12/2011 |
| JP | 2012-69256 A | 4/2012 |
| JP | 2012209215 A | 10/2012 |
| JP | 2015-76298 A | 4/2015 |
| WO | 2013/171966 A1 | 11/2013 |
| WO | 2014/024455 A1 | 2/2014 |

\* cited by examiner

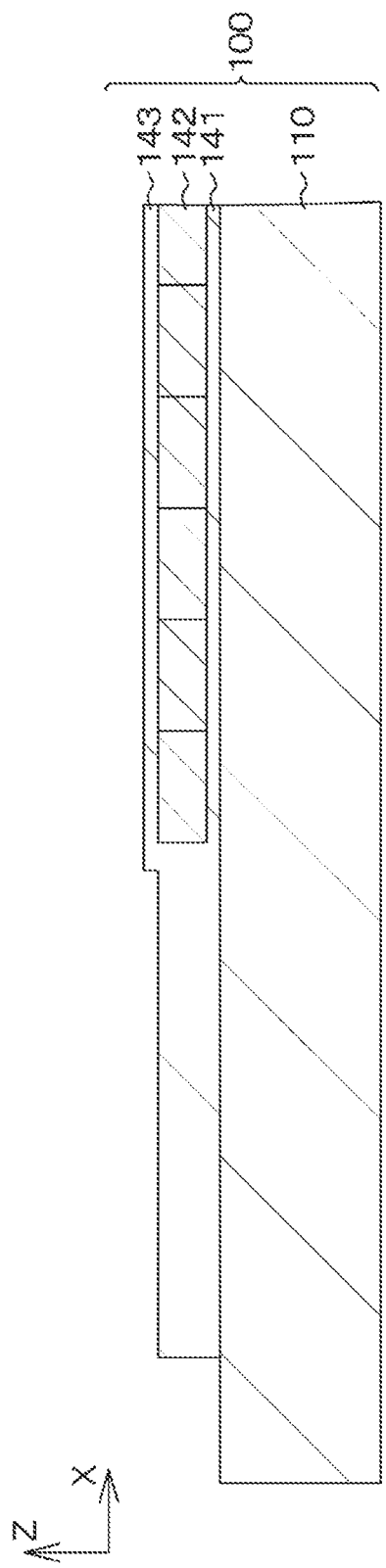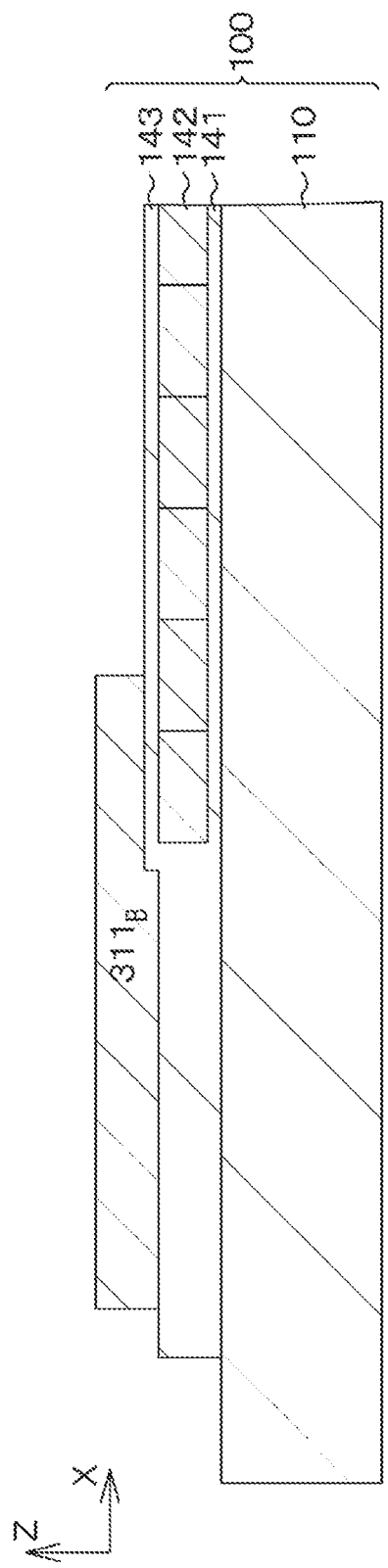

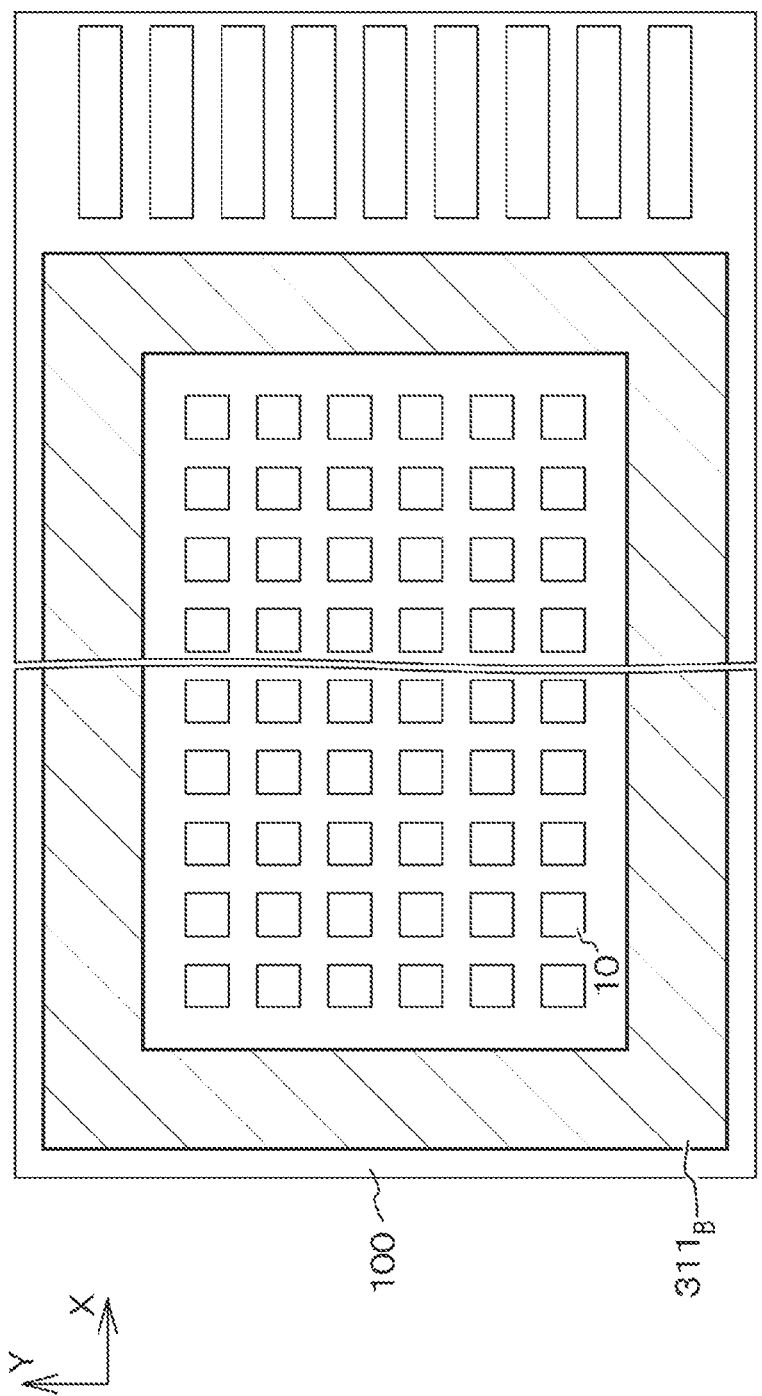

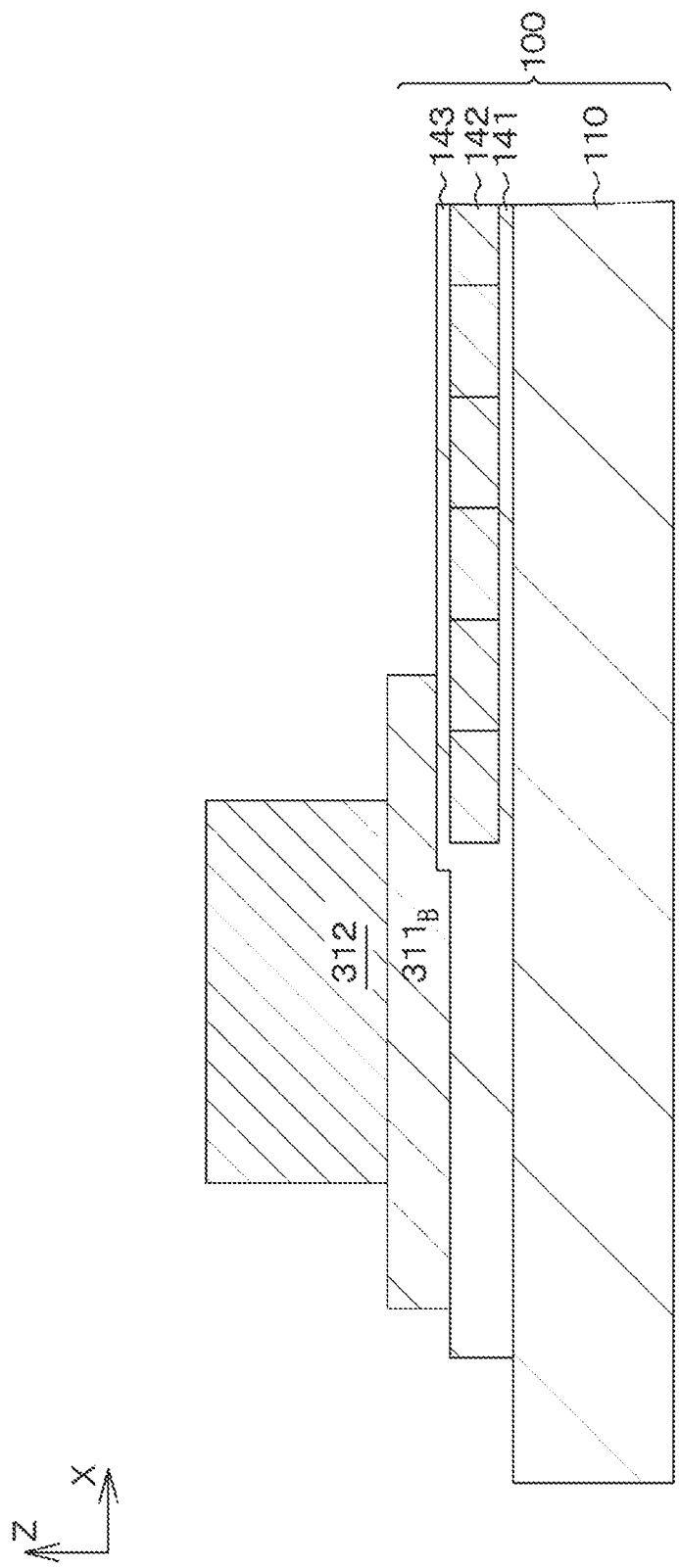

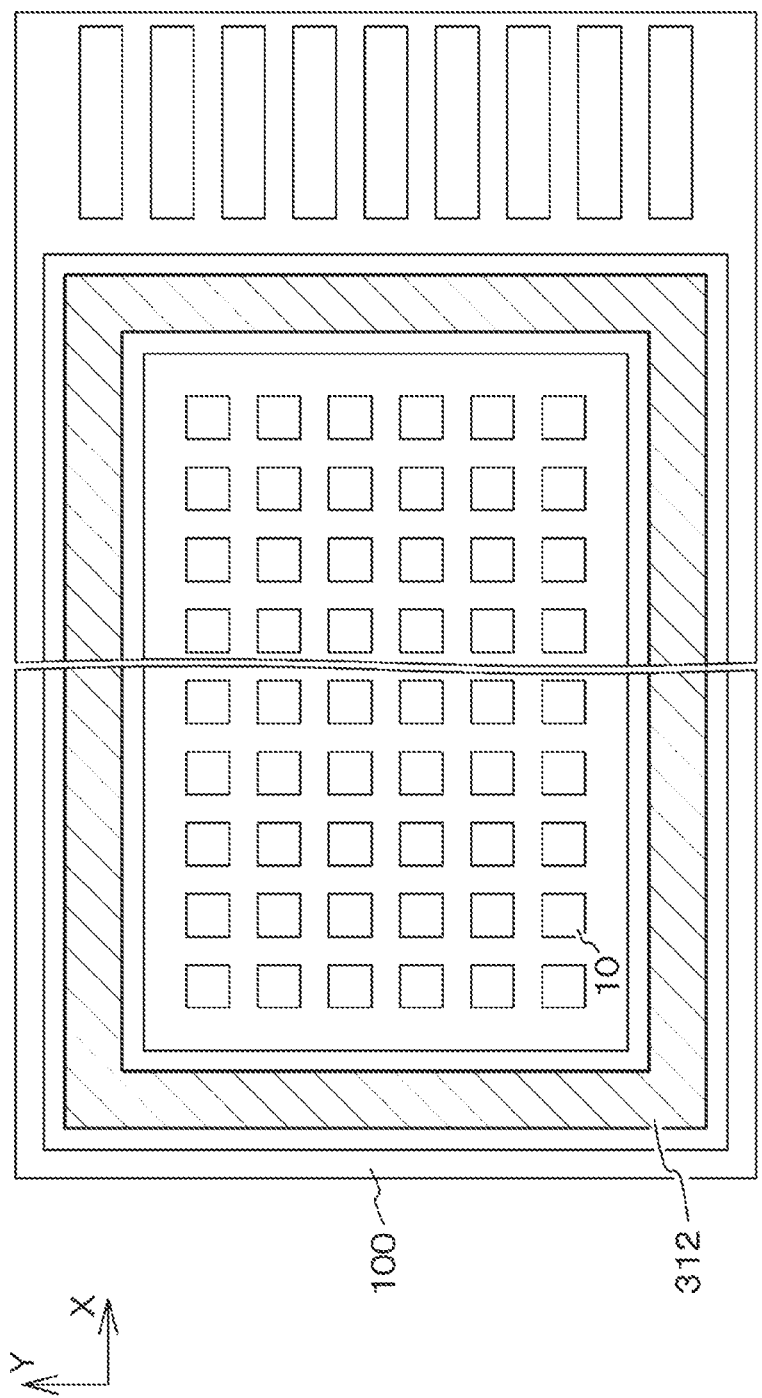

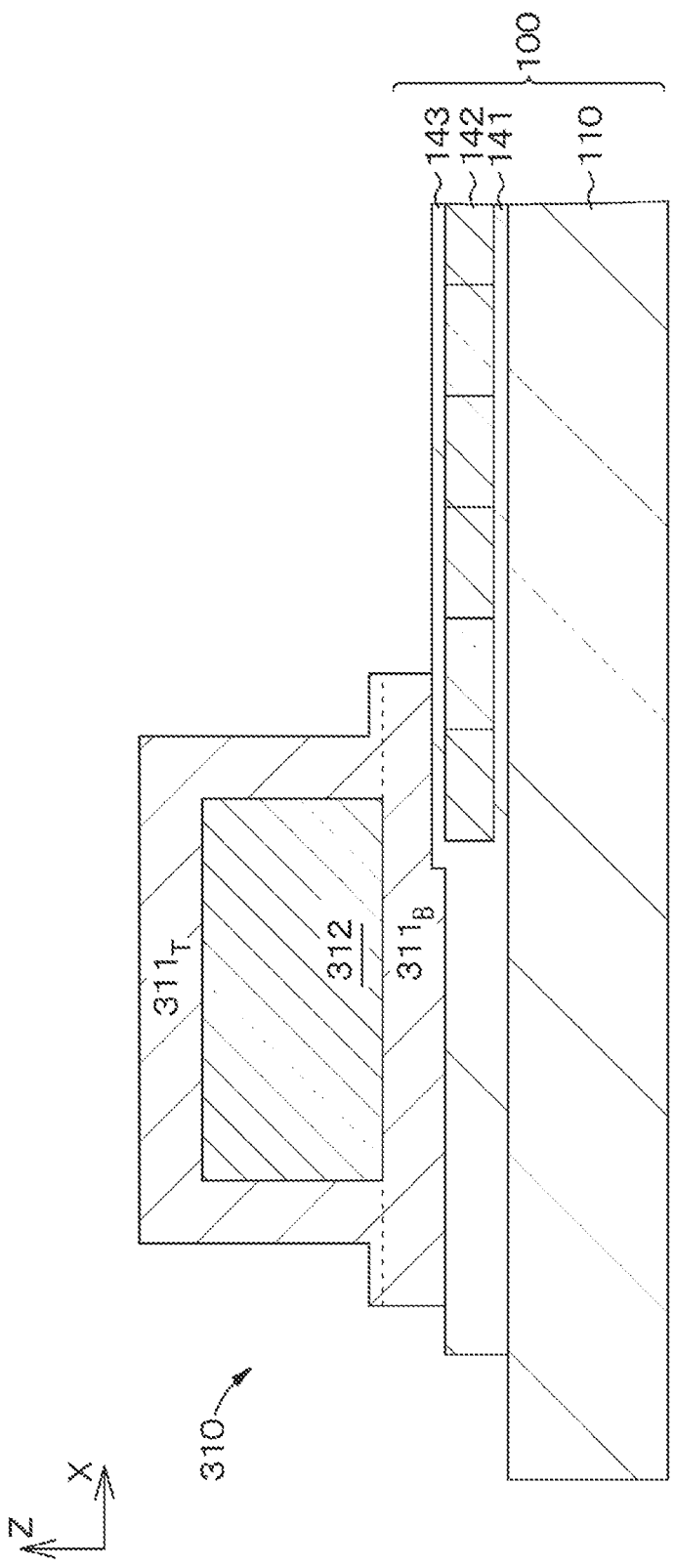

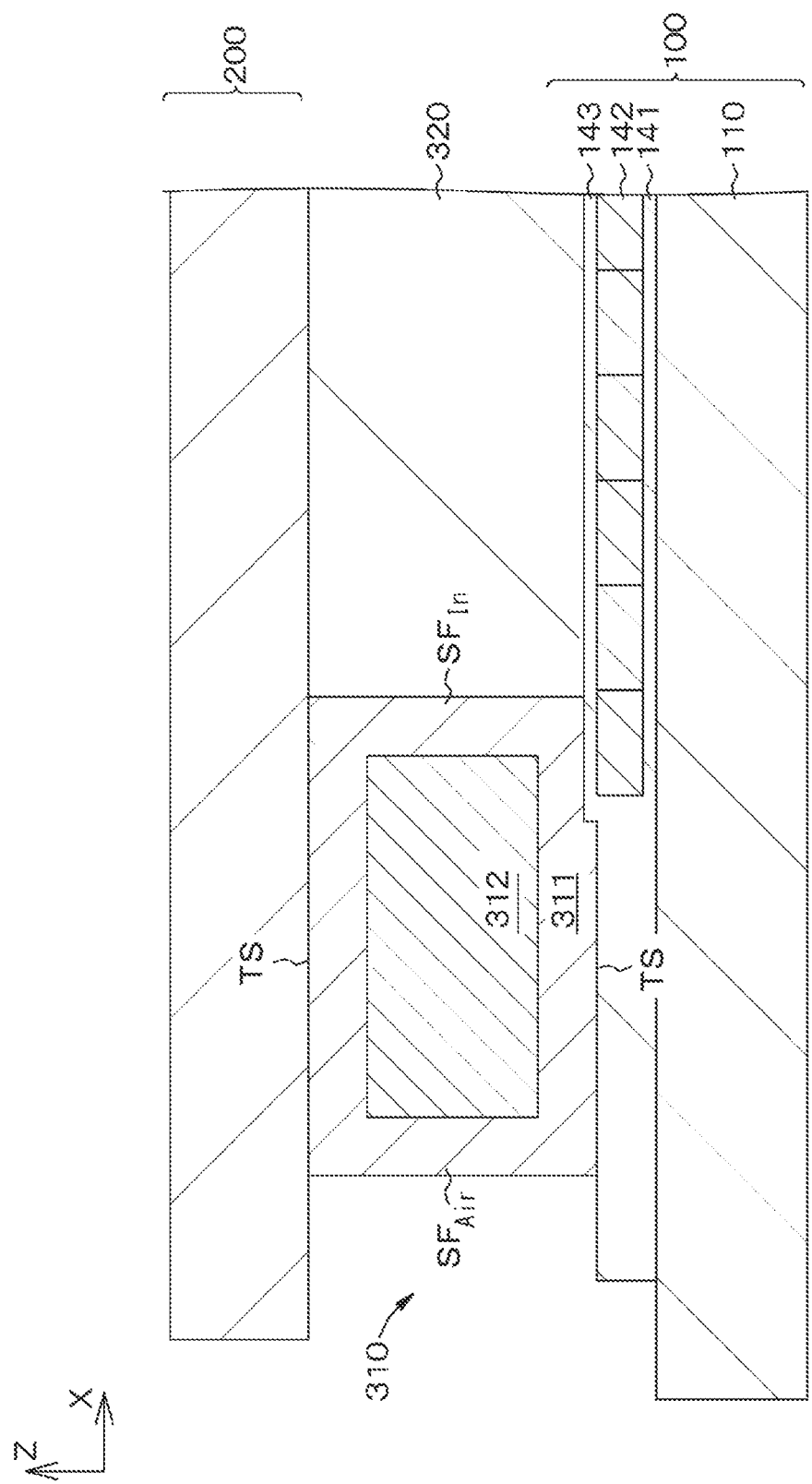

DISPLAY DEVICE AND ELECTRONIC APPARATUS

FIELD

The present disclosure relates to a display device and an electronic apparatus.

BACKGROUND

A display element including a light emitting unit driven by a current and a display device including such a display element are well known. For example, a display element including a light emitting unit including an organic electroluminescence element (hereinafter also simply referred to as an "organic EL light emitting unit") has attracted attention as a display element capable of high-luminance light emission by low-voltage direct-current drive.

In most cases, a display device including a display element including an organic EL light emitting unit is formed by bonding in which a second substrate is bonded to a first substrate including a stack of a drive circuit for driving the organic EL light emitting unit and the organic EL light emitting unit so that the second substrate faces the organic EL light emitting unit. The display element deteriorates when exposed to moisture in an atmosphere. For this reason, the peripheries of the first substrate and the second substrate are sealed with a sealing material.

The above-described display device is of a self-luminous type, and further, has satisfactory responsiveness to a high-definition high-speed video signal. In a display device to be mounted on eyewear such as spectacles and goggles, for example, it is also required to set a pixel size to about several micrometers to 10 micrometers. In such applications, the display device is formed as a module having a configuration in which a second substrate is bonded to a chip-shaped first substrate, and there is a demand for further miniaturization and cost reduction.

The outer frame of the display area of the display device needs to be a light shielding area. A configuration in which a frame-shaped member is prepared separately from the substrate and bonded to the substrate causes expansion of the outer shape and cost increase. Thus, it has been proposed that a light shielding unit is formed of a stack of color filters and a sealing material is applied onto the light shielding unit, to bond the second substrate to the first substrate (see Patent Literature 1, for example). It has further been proposed that light shielding performance is imparted to a sealing material (see Patent Literature 2, for example).

CITATION LIST

Patent Literature

Patent Literature 1: JP 2015-76298 A
Patent Literature 2: JP 2012-69256 A

SUMMARY

Technical Problem

In the case of the configuration in which bonding is achieved by application of a sealing material onto a light shielding unit formed of stacked color filters, the ends of the color filters are placed in the end surfaces of the display device. Because of a relatively high moisture permeability of a material forming the color filters, there remains a problem in terms of moisture permeability. Further, imparting light shielding performance to the sealing material reduces adhesion. Thus, in a case where a sealing region is made smaller as the size is reduced, there remains a problem in terms of adhesion.

Therefore, it is an object of the present disclosure to provide a display device having a configuration suitable for size reduction and with low moisture permeability and excellent adhesion owing to sealing, and an electronic apparatus including the display device.

Solution to Problem

To solve the problems described above, a display device according to the present disclosure includes: a first substrate including a display area including display elements arranged in a matrix; a second substrate including a transparent material; and a seal portion placed so as to surround a periphery of the display area, wherein the seal portion includes a core including a light shielding material and a covering member including a sealing material, and the first substrate and the second substrate are sealed while a surface of the covering member in the seal portion serves as a contact surface.

To solve the problems described above, an electronic apparatus according to the present disclosure includes a display device, wherein the display device includes: a first substrate including a display area including display elements arranged in a matrix; a second substrate including a transparent material; and a seal portion placed so as to surround a periphery of the display area, the seal portion includes a core including a light shielding material and a covering member including a sealing material, and the first substrate and the second substrate are sealed while a surface of the covering member in the seal portion serves as a contact surface.

BRIEF DESCRIPTION OF DRAWINGS

FIG. 1A is a schematic plan view of the display device as viewed from the front. FIG. 1B is a schematic cross-sectional view taken along a line A-A in FIG. 1.

FIGS. 5A and 5B are schematic partial cross-sectional views for explaining sealing steps of the first substrate and the second substrate.

FIG. 6 is a schematic plan view for explaining a shape in plan view of a covering member including a sealing material applied in the step of FIG. 5B.

FIG. 7 is a schematic partial cross-sectional view for explaining a sealing step of the first substrate and the second substrate, being performed following the step of FIG. 5B.

FIG. 8 is a schematic plan view for explaining a shape in plan view of a core including a light shielding material applied in the step of FIG. 7.

FIG. 9 is a schematic partial cross-sectional view for explaining a sealing step of the first substrate and the second substrate, being performed following the step of FIG. 7.

FIG. 13 is a schematic partial cross-sectional view for explaining a sealed state of the first substrate and the second substrate in a case where the core including the light shielding material and the covering member including a sealing material are applied in one operation.

DESCRIPTION OF EMBODIMENTS

Figure 1A:
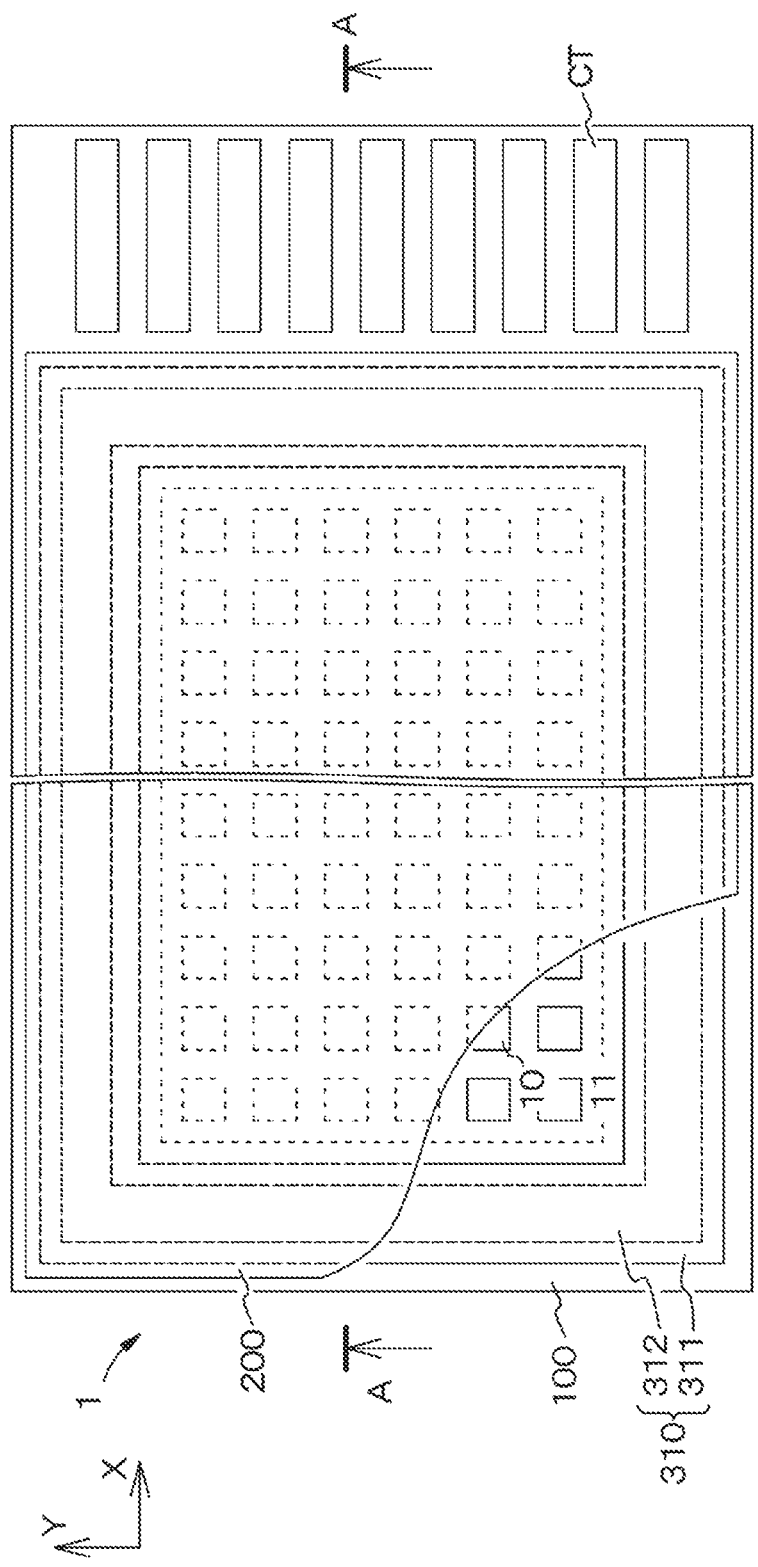
FIGS. 1A and 1B are schematic views for explaining a display device according to a first embodiment.

Hereinafter, the present disclosure will be described based on embodiments with reference to the drawings. The present disclosure is not limited to the embodiments, and various numerical values and materials in the embodiments are mere examples. In the following description, the same reference signs will be used for the same elements or elements having the same functions, and duplicated description will be omitted. The description will be given in the following order.
1. Comprehensive description of a display device and an electronic apparatus according to the present disclosure.
2. First embodiment
3. Various modifications
4. Description of electronic apparatus and others Comprehensive Description of Display Device and Electronic Apparatus According to the Present Disclosure As described above, a display device according to the present disclosure and a display device used in an electronic apparatus according to the present disclosure (which will hereinafter be also simply referred to as "a display device of the present disclosure) each include:
a first substrate including a display area including display elements arranged in a matrix;
a second substrate including a transparent material;
a seal portion placed so as to surround a periphery of the display area, wherein
the seal portion includes a core including a light shielding material and a covering member including a sealing material, and
the first substrate and the second substrate are sealed so as to have a contact surface corresponding to a surface of the covering member in the seal portion.

The display device of the present disclosure can have a configuration in which among the side surfaces of the seal portion except the contact surface, at least one of the outer side surface and the inner side surface with respect to the display device is covered with the covering member. In this case, from the viewpoint of lowering the moisture permeability, a configuration in which among the surfaces of the seal portion except the contact surface, both the outer side surface and the inner side surface with respect to the display device are covered with the covering member, is preferable.

In the display device of the present disclosure having the above-described various preferable configurations, there can be formed a configuration in which at least one of the first substrate and the second substrate includes a light shielding unit that includes stacked color filters and is formed so as to surround the periphery of the display area, and a part of the light shielding unit overlapping the seal portion is removed in a groove shape along the seal portion. In general, a material forming a color filter has high moisture permeability. Thus, by forming a configuration in which the covering member is buried in a region where the light shielding unit is removed in a groove shape, it is possible to keep the moisture permeability low owing to the seal portion.

In the display device of the present disclosure having the above-described various preferable configurations, the covering member can be configured to include a sealing material using a resin. In this case, the covering member can be configured to include a thermosetting resin or a photocurable resin. Because of a light shielding property of the core, it is preferable that the covering member includes a thermosetting resin in terms of the efficiency of a curing treatment. The covering member can be configured to include an acrylic resin and a urethane resin, or a resin formed of a mixture of these resins.

Alternatively, the covering member can be configured to include a sealing material using low-melting-point glass. Examples of the low-melting-point glass include so-called frit glass. By using low-melting-point glass as the sealing material, it is possible to obtain higher confidentiality than that in the case of using a resin.

In the display device of the present disclosure having the above-described various preferable configurations, the covering member can be configured to include a sealing material containing a spacer. As the spacer, a spherical or cylindrical body formed of an inorganic insulator such as silica can be used. Mixing the spacer enables adjustment of the viscosity and strength of the sealing material, and can keep the thickness of the covering member in the seal portion substantially constant.

In the display device of the present disclosure having the above-described various preferable configurations, the core can be configured to include a light shielding material using a black resin. In this case, the core can be configured to include a thermosetting or photocurable polyimide resin mixed with at least one of a black pigment, carbon black, and titanium black.

In the display device of the present disclosure including the above-described various preferable configurations, the display element can be configured to include a light emitting unit including an organic electroluminescence element, an LED element, a semiconductor laser element, and the like. These elements can be formed using well-known materials and methods. In view of forming a planar display device, it is preferable that the display element is configured to include a light emitting unit including an organic electroluminescence element, in particular.

The display device of the present disclosure can be configured to include a drive circuit for driving the light emitting unit. The light emitting unit and the drive circuit can be connected via a conductive portion including a via or the like provided in an interlayer insulating film, for example.

Examples of a material forming the substrate include a semiconductor material, a glass material, and a plastic material. In forming the drive circuit with a transistor formed on a semiconductor substrate, a well region is provided in a semiconductor substrate formed of silicon, for example, and a transistor is formed in the well region. Alternatively, in forming the drive circuit with a thin film transistor or the like, a thin semiconductor film is formed on a substrate formed of a glass material or a plastic material to form the drive circuit. Various wires can have known configurations or structures.

In the display device of the present disclosure, a configuration of a drive circuit or the like that controls light emission of the light emitting unit is not limited to any particular kind. The light emitting unit, for example, can be formed in a certain plane on the substrate and can be configured to be placed above a drive circuit that drives the light emitting unit with an interlayer insulating layer interposed. The configuration of the transistor forming the drive circuit is not limited to any particular kind. Either a p-channel field effect transistor or an n-channel field effect transistor may be used.

In the display device of the present disclosure, the light emitting unit can be configured as a so-called top-emission type. For example, a light emitting unit including an organic electroluminescence element includes an organic layer that includes a hole transport layer, a light emitting layer, an electron transport layer, and the like and is sandwiched between a lower electrode and an upper electrode. In a case where a common cathode is used, the upper electrode serves as a cathode electrode, and the lower electrode serves as an anode electrode.

The lower electrode is provided for each light emitting unit on the substrate. In a case where a common cathode is used, the lower electrode functions as an anode electrode of the light emitting unit. The lower electrode can be formed of a metal, a metal alloy, or the like such as aluminum (Al), an aluminum alloy, platinum (Pt), gold (Au), chromium (Cr), or tungsten (W). Alternatively, the lower electrode may be formed of a stack of a transparent conductive material layer such as indium tin oxide (ITO) or indium zinc oxide (IZO) and a reflective layer including a light reflective material. The thickness of the lower electrode is preferably set to a range of 100 to 300 nanometers.

The organic layer is formed of a stack of a plurality of material layers and is provided as a common continuous film over the whole surface including the lower electrode and a partition wall. The organic layer emits light upon application of a voltage between the lower electrode and the upper electrode. The organic layer can have, for example, a configuration in which a hole injection layer, a hole transport layer, a light emitting layer, an electron transport layer, and an electron injection layer are stacked sequentially in this order from the lower-electrode side. A hole transport material, a hole transport material, an electron transport material, and an organic light-emitting material forming the organic layer are not limited to any particular kind of material, and known materials can be used.

The organic layer may include a stacked structure of a plurality of light emitting layers. For example, either light emitting layers that emit red light, blue light, and green light, respectively, or light emitting layers that emit blue light and yellow light, respectively, are stacked, thereby forming a light emitting unit that emits white light.

The display device of the present disclosure can have a color display configuration. In the case of color display, the color filter can be formed using, for example, a resin material containing a pigment or a dye. Additionally, in some cases, a so-called monochrome display configuration may be employed. In the case of monochrome display, one display element forms one pixel.

In the case of color display, one display element forms one subpixel. For example, one pixel can be configured to include a plurality of subpixels. More specifically, one pixel can be configured to include three subpixels of a red display subpixel, a green display subpixel, and a blue display subpixel. Furthermore, one pixel can be formed of a set of subpixels further including one or more types of subpixels in addition to those three types of subpixels (a set further including a subpixel that emits white light to improve luminance, a set further including subpixels that emit complementary colors to expand a color reproduction range, a set further including a subpixel that emits yellow to expand a color reproduction range, and a set further including subpixels that emit yellow and cyan to expand a color reproduction range, for example).

A partition wall partitioning adjacent display elements off each other can be formed using a material appropriately selected from known inorganic materials and organic materials, and can be formed by combination of a known film forming method such as a physical vapor deposition method (PVD method) including a vacuum vapor deposition method and a sputtering method as examples thereof or various chemical vapor deposition methods (CVD method), and a known patterning method such as an etching method or a lift-off method, for example.

Examples of a pixel value of the display device include some image display resolutions such as (1920, 1035), (720, 480), (1280, 960), and the like, in addition to VGA (640, 480), S-VGA (800, 600), XGA (1024, 768), APRC (1152, 900), S-XGA (1280, 1024), U-XGA (1600, 1200), HD-TV (1920, 1080), and Q-XGA (2048, 1536). However, the pixel value is not limited to those values.

Examples of the electronic apparatus including the display device of the present disclosure include a direct-view image display device, a projection image display device, and other various electronic apparatuses having an image displaying function.

The conditions shown in the various expressions in the present specification are satisfied not only when the expressions are precisely valid in a mathematical sense, but also when the expressions are substantially valid. With regard to the validity of the expressions, various design or manufacturing variations of the display device are allowed. Further, the drawings referred to in the following description are schematic. For example, FIG. 3 described later illustrates a cross-sectional structure of the display device, but does not show a ratio between a width, a height, a thickness, and the like.

First Embodiment

A first embodiment relates to a display device according to a first aspect of the present disclosure.

Figure 1B:
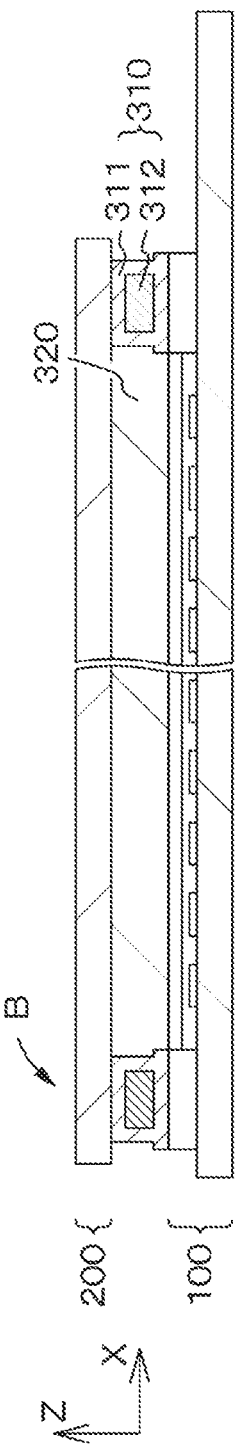

FIGS. 1A and 1B are schematic views for explaining a display device according to a first embodiment. FIG. 1A is a schematic plan view of the display device as viewed from the front. FIG. 1B is a schematic cross-sectional view taken along a line A-A in FIG. 1. FIG. 1A illustrates a cut-out part of a second substrate 200 described later.

A display device 1 includes:
a first substrate 100 including a display area 11 including display elements 10 arranged in a matrix;
a second substrate 200 including a transparent material; and
a seal portion 310 placed so as to surround a periphery of the display area 11. Although many display elements 10 are arranged actually, they are illustrated in a simplified manner for convenience of illustration. The same applies to other components.

The seal portion 310 includes a core 312 including a light shielding material and a covering member 311 including a sealing material. The first substrate 100 and the second substrate 200 are sealed so as to have a contact surface corresponding to a surface of the covering member 311 in the seal portion 310. For example, a filler 320 for optical coupling is placed between the first substrate 100 and the second substrate 200. Additionally, a portion between the first substrate 100 and the second substrate 200 may be hollow.

In a portion of the first substrate 100 that is not covered with the second substrate 200, an electrode CT for receiving a video signal and the like externally supplied is provided.

Figure 2:
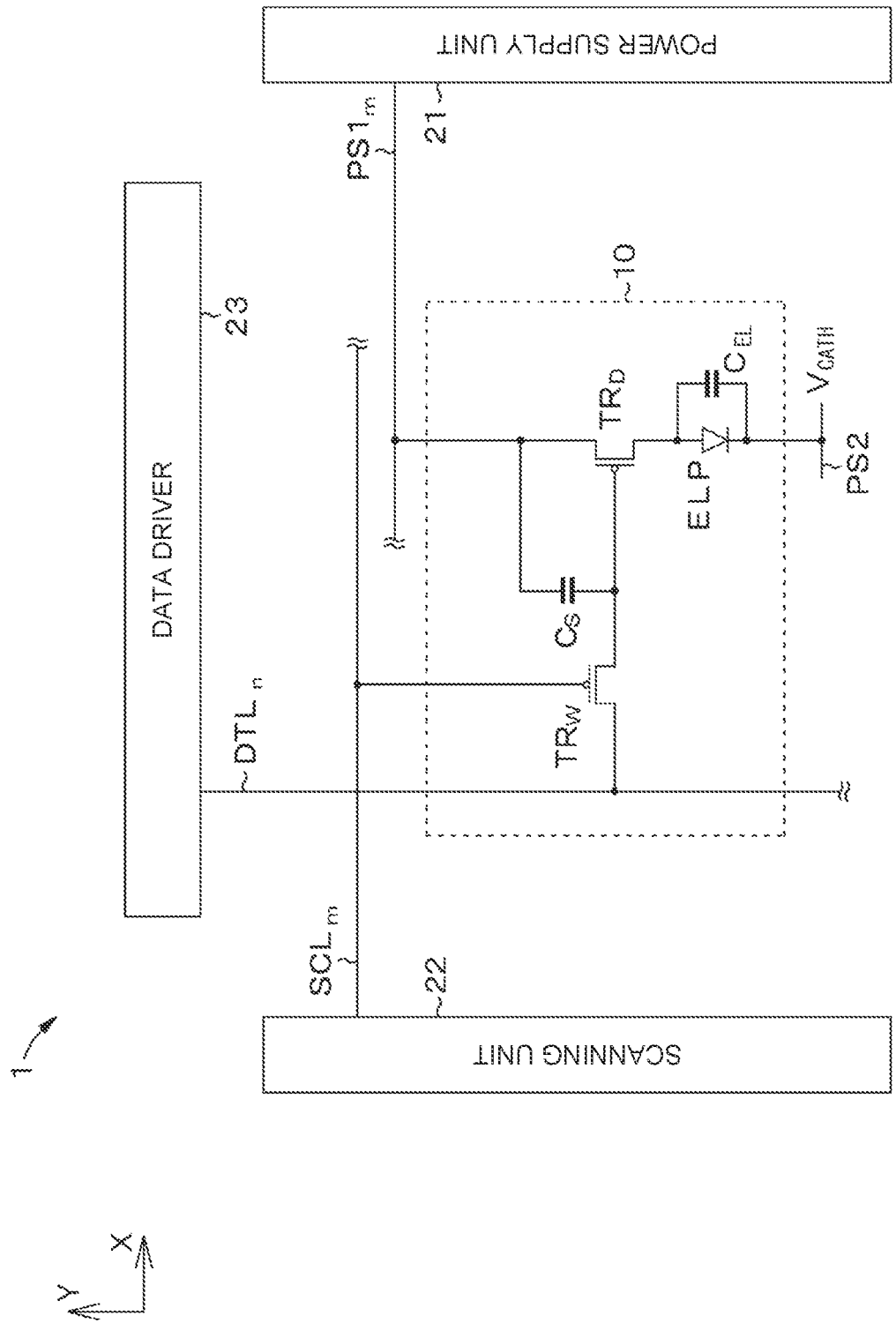
FIG. 2 is a schematic circuit diagram for explaining a basic configuration of a display element.

First, a configuration of the display device 1 will be described. FIG. 2 is a schematic circuit diagram for explaining a basic configuration of the display element. For convenience of illustration, FIG. 2 illustrates a connection relationship for one display element 10, more specifically, the display element 10 in the m-th row and the n-th column.

The display device 1 includes a power supply unit 21, a scanning unit 22, and a data driver 23. The display element 10 is formed on a support formed of glass, for example. The power supply unit 21, the scanning unit 22, and the data driver 23 are also formed on the same support. That is, the display device 1 is a drive-circuit-integrated display device. In some cases, the drive circuit may be formed separately.

The display element 10 includes a light emitting unit ELP driven by a current and a circuit that drives the light emitting unit ELP. The drive circuit includes at least a write transistor $TR_W$ that writes a video signal and a drive transistor $TR_D$ that causes a current to flow through the light emitting unit ELP. These are formed of p-channel transistors.

The drive circuit further includes a capacitor $C_S$. The capacitor $C_S$ is used to hold a voltage (so-called gate-source voltage) of a gate electrode with respect to a source region of the drive transistor $TR_D$. During light emission of the display element 10, one source/drain region (the side connected to a feeder line PS1 in FIG. 2) of the drive transistor $TR_D$ serves as a source region, and the other source/drain region serves as a drain region.

One electrode and the other electrode forming the capacitor $C_S$ are connected to the one source/drain region and the gate electrode of the drive transistor $TR_D$, respectively. The other source/drain region of the drive transistor $TR_D$ is connected to an anode electrode of the light emitting unit ELP.

The display element 10 includes the light emitting unit ELP including an organic electroluminescence element. The light emitting unit ELP is a light emitting unit that is driven by a current and has emission luminance varying depending on a value of a flowing current. The light emitting unit ELP has a known configuration or structure including an anode electrode, a hole transport layer, a light emitting layer, an electron transport layer, a cathode electrode, and the like.

The other end (specifically, the cathode electrode) of the light emitting unit ELP is connected to a common feeder line PS2. A predetermined voltage $V_{CATH}$ (for example, ground potential) is supplied to the common feeder line PS2. The capacitance of the light emitting unit ELP is denoted by a reference sign $C_{EL}$. If a problem occurs in driving due to the small capacitance $C_{EL}$ of the light emitting unit ELP, an auxiliary capacitance connected in parallel to the light emitting unit ELP may be provided as necessary.

The write transistor $TR_W$ includes a gate electrode connected to a scanning line SCL, one source/drain region connected to a data line DTL, and the other source/drain region connected to the gate electrode of the drive transistor $TR_D$. As a result, a signal voltage from the data line DTL is written into the capacitor $C_S$ via the write transistor $TR_W$.

As described above, the capacitor $C_S$ is connected between the one source/drain region and the gate electrode of the drive transistor $TR_D$. A power supply voltage $V_{CC}$ is applied from the power supply unit 21 to the one source/drain region of the drive transistor $TR_D$ via a feeder line $PS1_m$. When a video signal voltage $V_{Sig}$ from the data line DTL is written into the capacitor $C_S$ via the write transistor $TR_W$, the capacitor $C_S$ holds a voltage ($V_{CC}-V_{Sig}$) as a gate-source voltage of the drive transistor $TR_D$. A drain current $I_{ds}$ expressed by the following expression (1) flows through the drive transistor $TR_D$, and the light emitting unit ELP emits light with luminance corresponding to a current value.

$$I_{ds}=k\cdot\mu\cdot((V_{CC}-V_{Sig})-|V_{th}|)^2 \qquad (1),$$

where
μ: effective mobility,
L: channel length,
W: channel width,
$V_{th}$: threshold voltage,
$C_{ox}$: (relative dielectric constant of gate insulating layer)× (dielectric constant of vacuum)/(thickness of gate insulating layer), and $$k\equiv(1/2)\cdot(W/L)\cdot C_{ox}.$$

Figure 3:
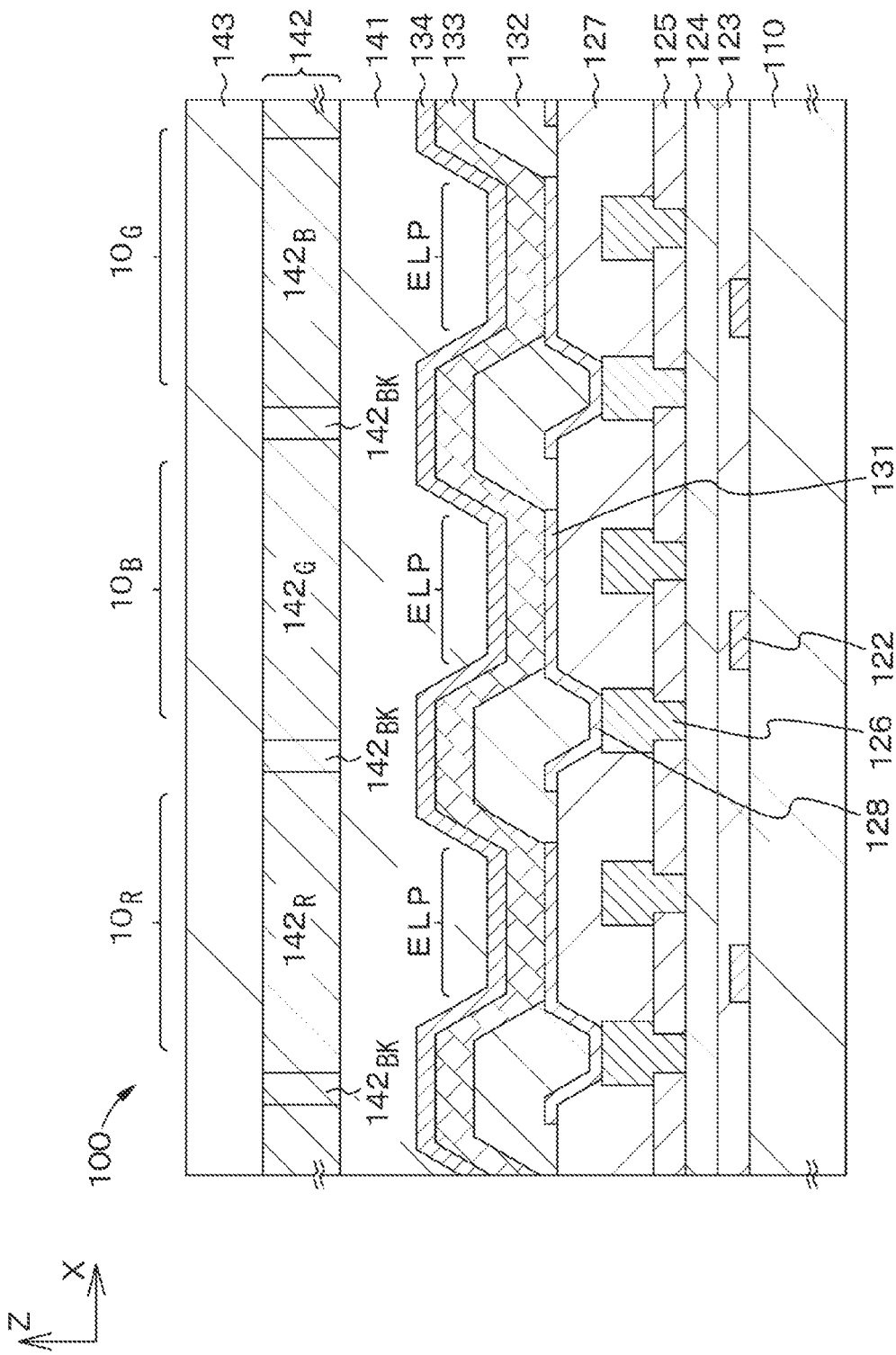
FIG. 3 is a schematic partial cross-sectional view of a portion including the display element in a first substrate.

Here, a three-dimensional arrangement of the light emitting unit ELP, the transistor, and the like in the first substrate 100 will be described. FIG. 3 is a schematic partial cross-sectional view of a portion including the display elements in the first substrate.

The drive circuit of the display element 10 is formed on a support 110 formed of glass, for example. On the support 110, there are formed a gate electrode 122, a gate insulating film 123 formed so as to cover the whole surface including the gate electrode 122, a semiconductor material layer 124 formed on the whole surface including the gate insulating film 123, an interlayer insulating film 125 formed so as to cover the whole surface including the semiconductor material layer 124, a source/drain electrode 126 connected to a source/drain region of a transistor formed in the semiconductor material layer 124, and a flattening film 127 formed so as to cover the whole surface including the source/drain electrode 126.

On the flattening film 127, an anode electrode 131 is formed for each display element 10. The anode electrode 131 is connected to the source/drain electrode 126 through a contact 128. A partition wall 132 that partitions the display elements is formed between adjacent ones of the anode electrodes 131.

An organic layer 133 is formed on the whole surface including the anode electrodes 131 and the partition walls 132. A light emitting layer of the organic layer 133 is formed over the pixels 10 in common, and basically emits white light. A cathode electrode 134 is formed on the whole surface including the organic layer 133. The cathode electrode 134 is formed of a material having excellent light transmittance and a small work function, such as indium zinc oxide (IZO), for example. The portion where the anode electrode 131, the organic layer 133, and the cathode electrode 134 are stacked forms the light emitting unit ELP illustrated in FIG. 3.

A protective film 141 is formed on the whole surface including the cathode electrode 134. The protective film 141 prevents moisture from entering into the organic layer 133 and is formed using a material having low water permeability. Color filters corresponding to colors to be displayed are arranged on the protective film 141. More specifically, color filters 142 include a color filter $142_R$ for a red display pixel $10_R$, a color filter $142_B$ for a blue display pixel $10_B$, and a color filter $142_G$ for a green display pixel $10_G$. A reference sign $142_{BK}$ denotes a portion of a so-called black matrix. Further, a protective film 143 is formed on the color filters 142. Light from the light emitting unit ELP is emitted via the color filters 142 and observed as a color image.

Hereinabove, a three-dimensional arrangement of the light emitting unit ELP, the transistor, and the like in the first substrate 100 has been described. Next, a sealed state of the first substrate and the second substrate will be described.

Figure 4:
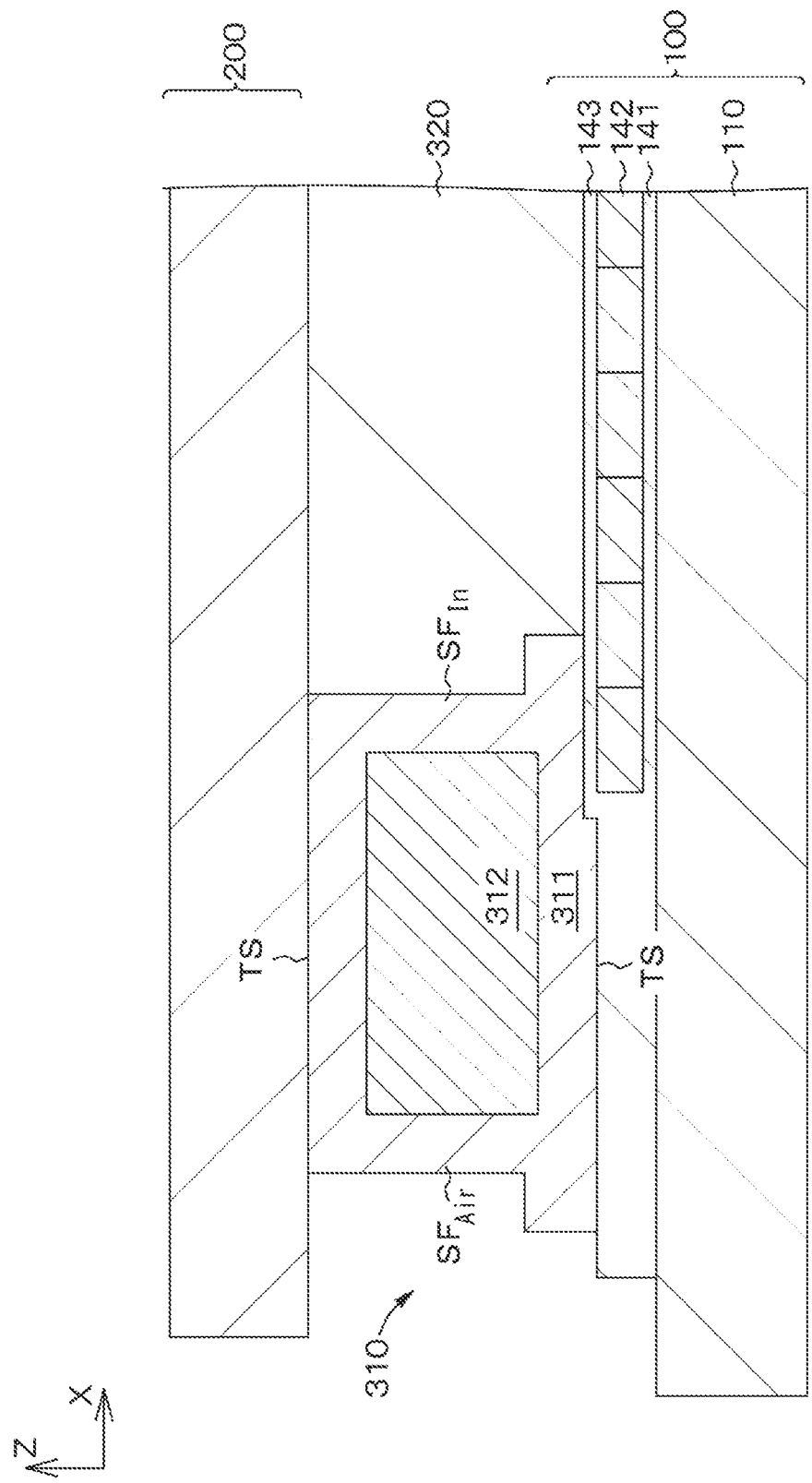
FIG. 4 is a schematic partial cross-sectional view for explaining a sealed state of the first substrate and a second substrate.

FIG. 4 is a schematic partial cross-sectional view for explaining a sealed state of the first substrate and the second substrate. For convenience of illustration, illustration of the semiconductor material layer, the light emitting unit ELP, and the like in the first substrate 100 is omitted. The same applies to other drawings described later.

The seal portion 310 includes a core 312 including a light shielding material and a covering member 311 including a sealing material. The core 312 includes a light shielding material using a black resin, more specifically, a thermosetting or photocurable polyimide resin mixed with at least one of a black pigment, carbon black, and titanium black.

The covering member 311 covering the core 312 includes a sealing material using a resin, and for example, is formed of a thermosetting resin or a photocurable resin. More specifically, the covering member 311 can be configured to include an acrylic resin and a urethane resin, or a resin formed of a mixture of these resins. Alternatively, in some cases, the covering member 311 can be configured to include a sealing material using low-melting-point glass.

In the display device 1, the first substrate 100 and the second substrate 200 are sealed so as to have a contact surface TS corresponding to a surface of the covering member 311 in the seal portion 310. The light shielding property of the seal portion 310 is secured mainly by the core 312. Thus, for the covering member 311, a material having low moisture permeability and high sealing property can be preferentially selected. Further, among the surfaces of the seal portion 310 except the contact surface TS, at least one of a side surface $SF_{Air}$ facing outward and a side surface $SF_{In}$ facing inward with respect to the display device 1 is covered with the covering member 311, while both of the side surfaces are covered in the example illustrated in the drawing.

Therefore, enough adhesion between the first substrate 100 and the second substrate 200 and excellent low moisture permeability to the inside can be secured, and further, a satisfactory light shielding property can be imparted to the periphery of the display area. Further, because of unnecessity of a frame for light shielding, it is possible to obtain a display device having a configuration suitable for size reduction and with low moisture permeability and excellent adhesion owing to sealing.

Next, an example of a sealing process of the display device 1 will be described.

FIGS. 5 to 11 are schematic partial cross-sectional views for explaining sealing steps of the first substrate and the second substrate.

[Step 100] (Refer to FIGS. 5A, 5B, and 6)

The first substrate 100 illustrated in FIG. 3 is prepared (refer to FIG. 5A), and a covering member $311_B$ is applied to an annular-shaped portion including a periphery of a display area (refer to FIGS. 5B and 6). In FIG. 6, a shape in plan view of the covering member $311_B$ including a sealing material applied in the step illustrated in FIG. 5B is illustrated with hatching.

[Step 110] (Refer to FIGS. 7 and 8)

Subsequently, the core 312 is applied onto the covering member $311_B$. In this example, the core 312 is applied so as to have a width narrower than that of the covering member $311_B$. In FIG. 8, a shape in plan view of the core 312 including a light shielding material applied in the step illustrated in FIG. 7 is illustrated with hatching.

Figure 10:
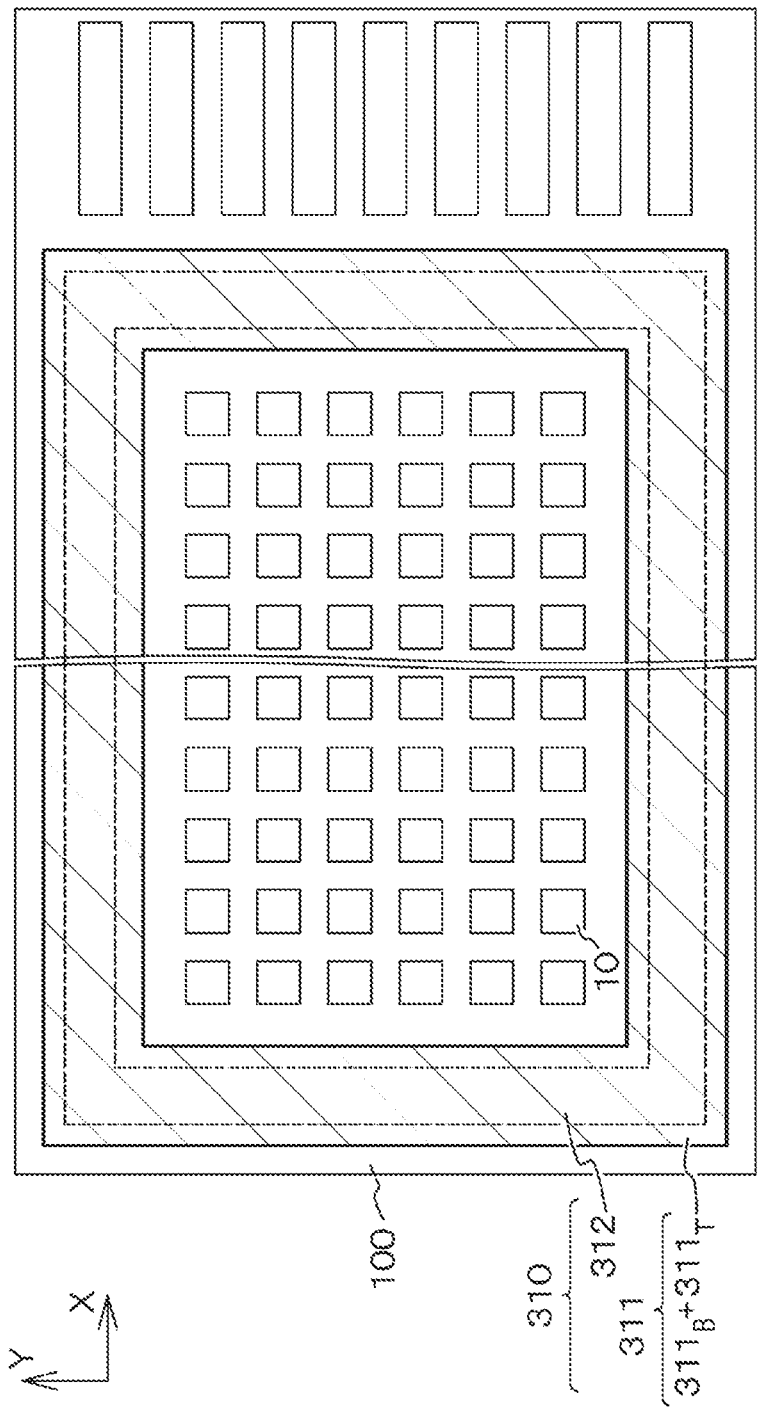
FIG. 10 is a schematic plan view for explaining a shape in plan view of the covering member including a sealing material applied in the step of FIG. 9.

[Step 120] (Refer to FIGS. 9 and 10)

Subsequently, a covering member $311_T$ is applied onto the covering member $311_B$ including the core 312. The covering member $311_T$ is applied so as to have the same width as the covering member $311_B$, so that also portions corresponding to the side surface $SF_{Air}$ and the inner side surface $SF_{In}$ are covered with the covering member $311_T$. In FIG. 10, a shape in plan view of the covering member $311_T$ including a sealing material applied in the step illustrated in FIG. 9 is illustrated with hatching.

By the above-described steps, the seal portion 310 including the core 312 and the covering members $311_B$ and $311_T$ is formed.

Figure 11:
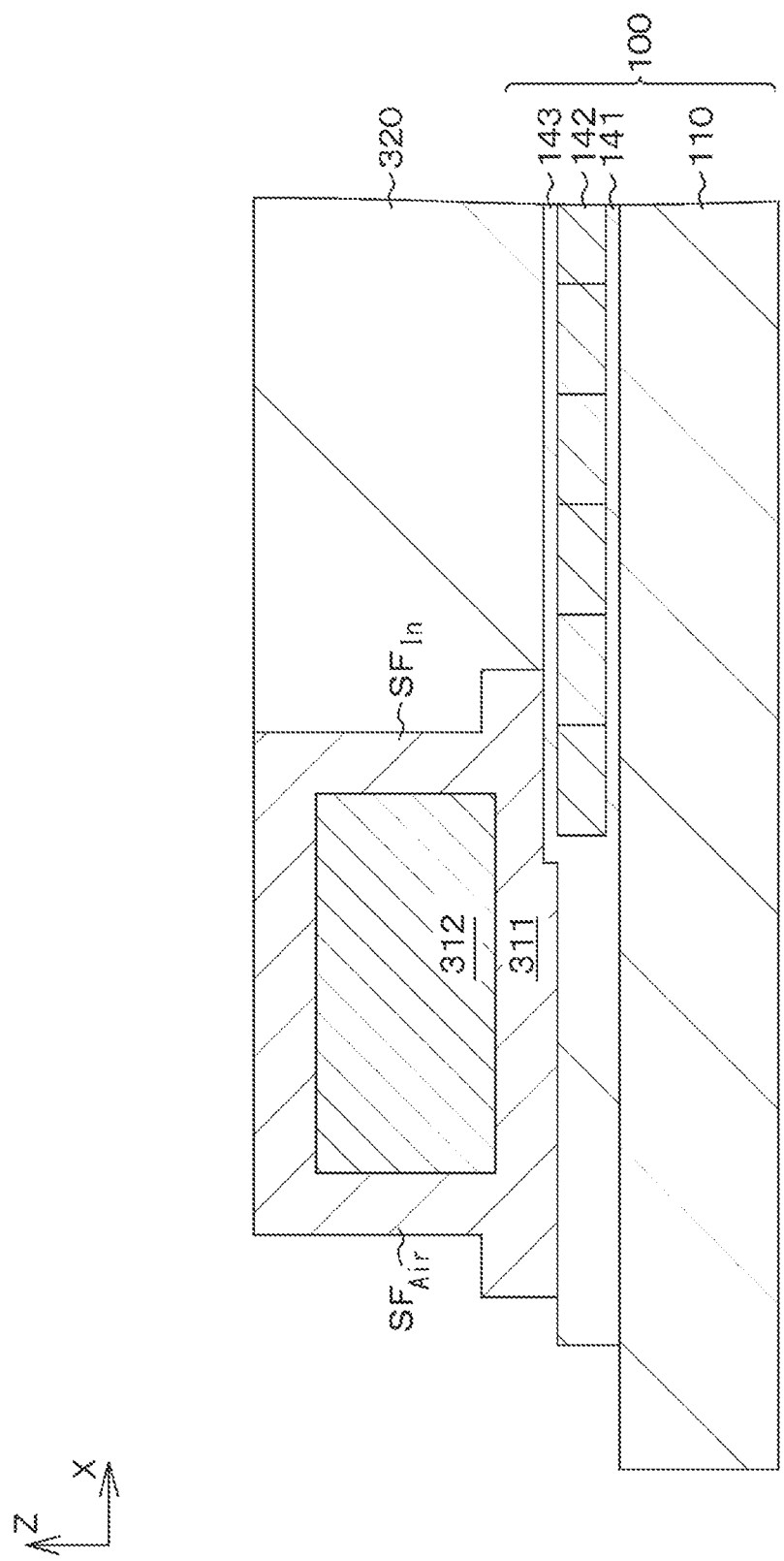
FIG. 11 is a schematic partial cross-sectional view for explaining a sealing step of the first substrate and the second substrate, being performed following the step of FIG. 9.

[Step 130] (Refer to FIG. 11)

Then, after the filler 320 is applied (refer to FIG. 11), the second substrate 100 is aligned and bonded. It is possible to achieve a curing treatment of the seal portion 310 by performing a treatment such as thermal curing or photocuring depending on a material forming the seal portion 310.

Additionally, though the core and the covering member are applied separately from each other in the above-described steps, they can also be applied in one operation.

Figure 12B:
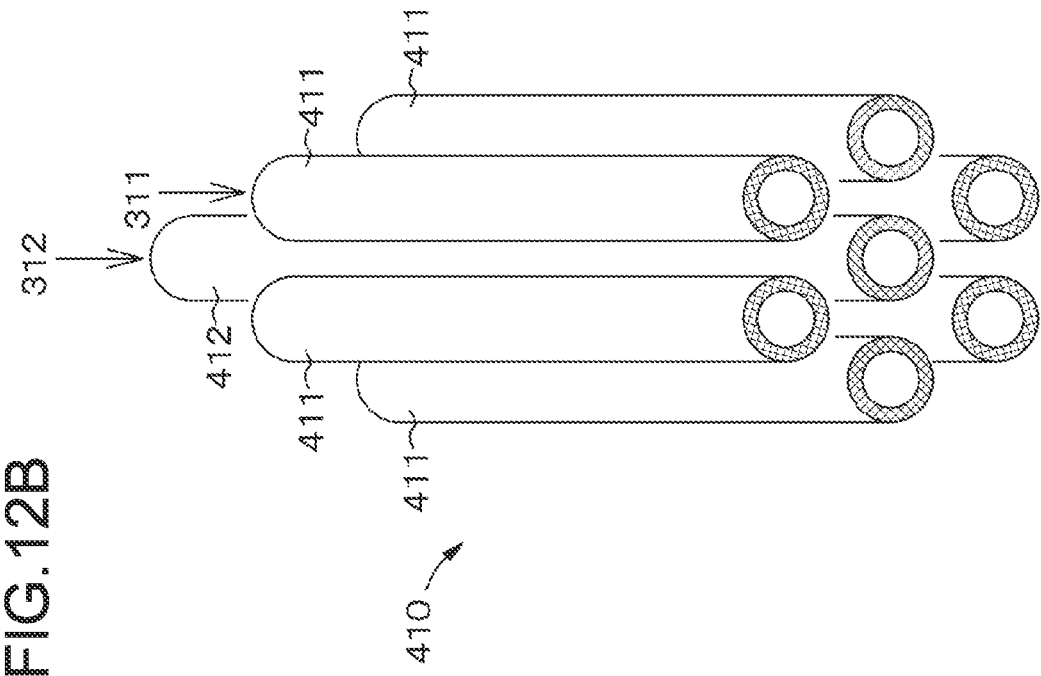
FIGS. 12A and 12B are schematic views for explaining nozzle structures used in applying the core including the light shielding material and the covering member including the sealing material in one operation.
Figure 12A:
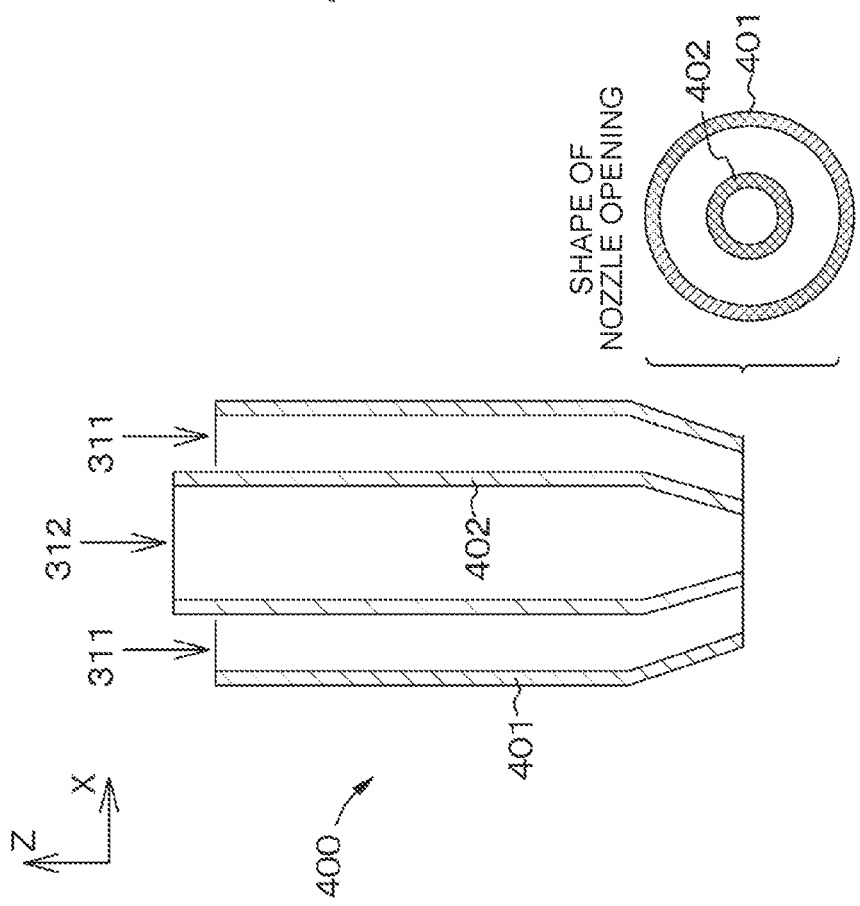

FIGS. 12A and 12B are schematic views for explaining nozzle structures used in applying the core including the light shielding material and the covering member including the sealing material in one operation.

A coaxial structure nozzle 400 illustrated in FIG. 12A includes an inner nozzle 402 and an outer nozzle 401 arranged coaxially. Then, the core 312 is discharged from the inner nozzle 402, and at the same time, the covering member 311 is discharged from the outer nozzle 401. By using the nozzle 400, the core 312 and the covering member 311 can be applied in one operation.

The nozzle assembly 410 illustrated in FIG. 12B is formed as a collection of a plurality (seven in the example illustrated in the drawing) small nozzles. Specifically, six nozzles 411 are arranged around a center nozzle 412. Then, the core 312 is discharged from the center nozzle 412, and at the same time, the covering member 311 is discharged from the nozzles 411 around the center nozzle 412. By using the nozzle 410, the core 312 and the covering member 311 can be applied in one operation.

FIG. 13 is a schematic partial cross-sectional view for explaining a sealed state of the first substrate and the second substrate in a case where the core including the light shielding material and the covering member including the sealing material are applied in one operation.

In the case of applying in plural operations, a portion of the covering member 311 close to the first substrate 100 in the seal portion 310 is likely to have a larger width as illustrated in FIG. 9. In the case of applying in one operation, basically, the widths of the portions of the covering member 311 close to the first substrate 100 and the second substrate 200, respectively, are substantially the same with each other as illustrated in FIG. 13. In the present disclosure, either configuration may be adopted.

Figure 14:
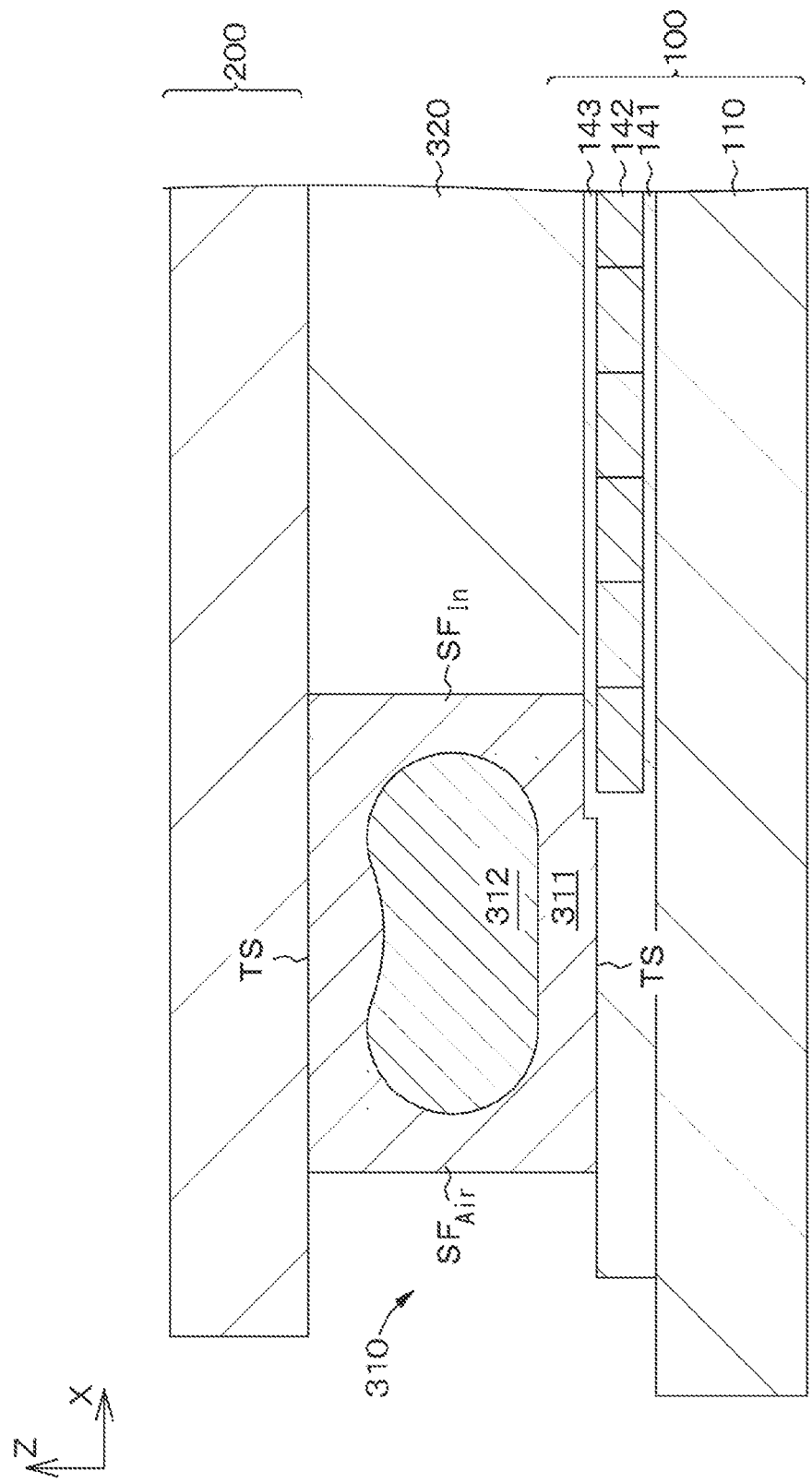
FIG. 14 is a schematic partial cross-sectional view for explaining a more specific example of a cross-sectional shape of the core.

Additionally, though the cross section of the core 312 is illustrated in a substantially rectangular shape in the drawings referred to in the above description, the illustration is a mere example for the sake of convenience. Actually, the cross section of the core 312 can take various shapes depending on application and bonding. FIG. 14 is a schematic partial cross-sectional view for explaining a more specific example of a cross-sectional shape of the core.

The above-described display device can be variously modified. Below, various modifications will be described.

Various Modifications

Figure 15:
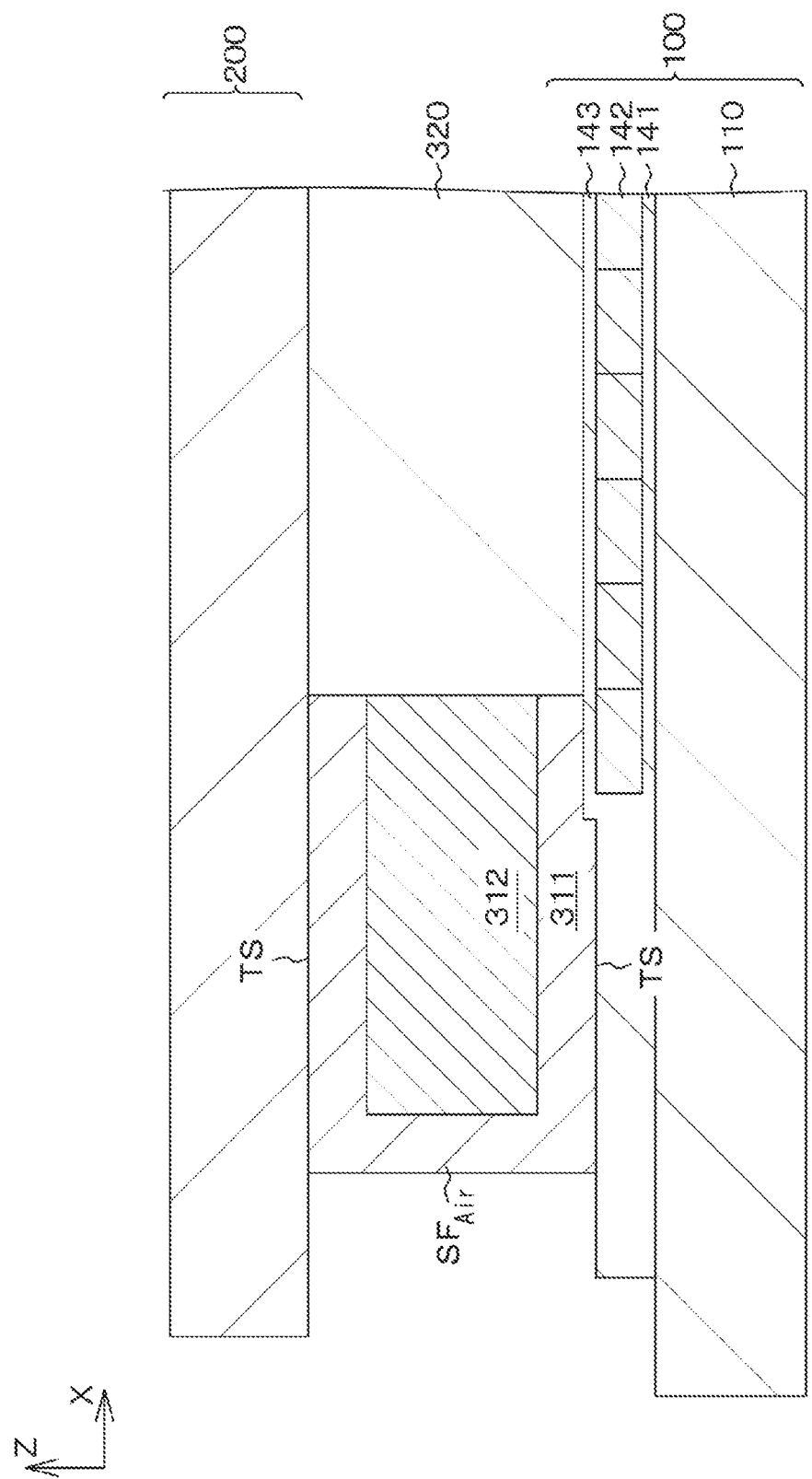
FIG. 15 is a schematic partial cross-sectional view for explaining a sealed state of the first substrate and the second substrate according to a first modification.
Figure 16:
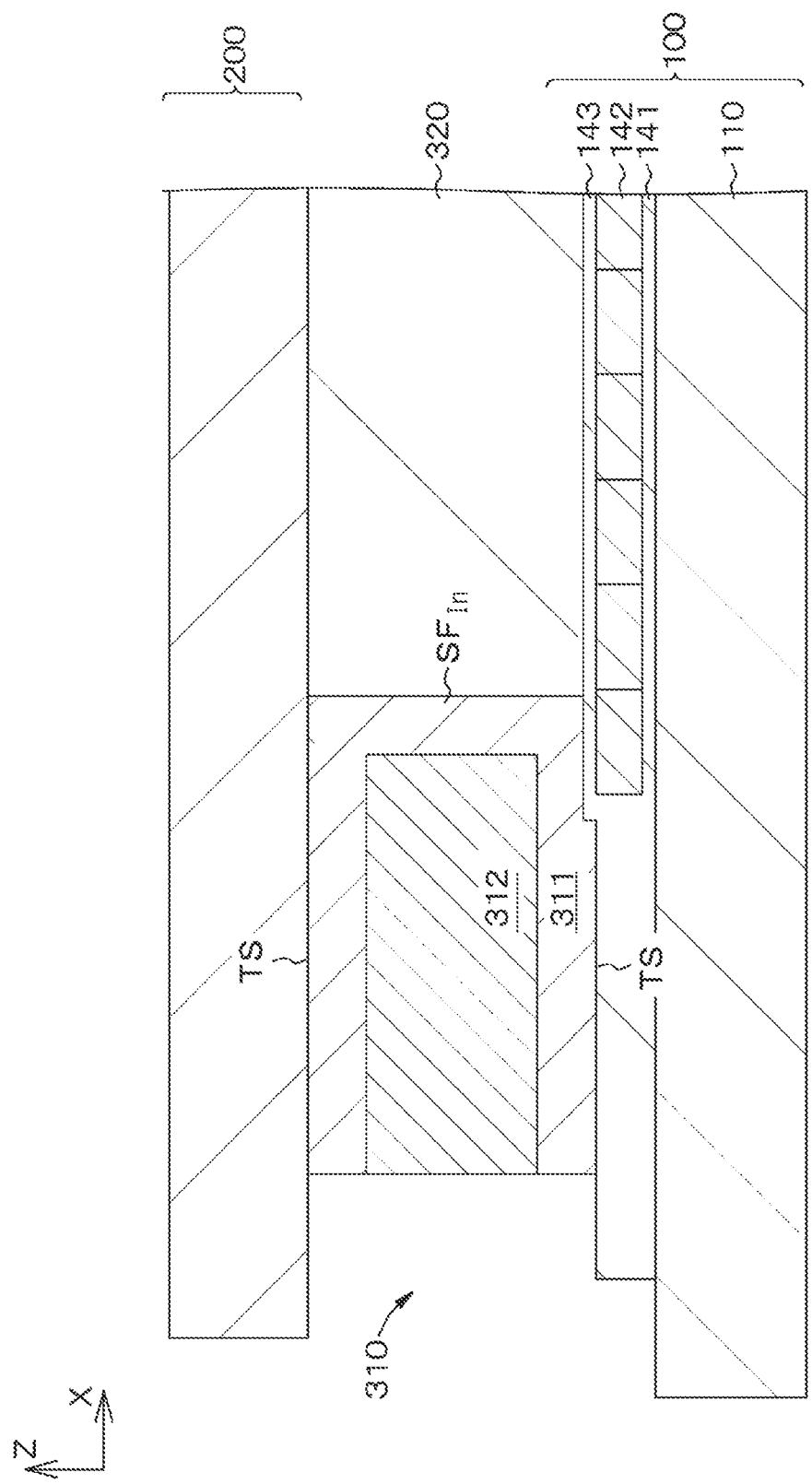
FIG. 16 is a schematic partial cross-sectional view for explaining a sealed state of the first substrate and the second substrate according to a second modification.

FIG. 15 is a schematic partial cross-sectional view for explaining a sealed state of the first substrate and the second substrate according to a first modification. FIG. 16 is a schematic partial cross-sectional view for explaining a sealed state of the first substrate and the second substrate according to a second modification.

In the examples illustrated in FIGS. 15 and 16, among the side surfaces of the seal portion 310 except the contact surface, one of the outer side surface $SF_{Air}$ and the inner side surface $SF_{In}$ with respect to the display device 1 is covered with the covering member 311. Also with such a configuration, moisture permeability can be kept low owing to the seal portion 310.

Figure 17:
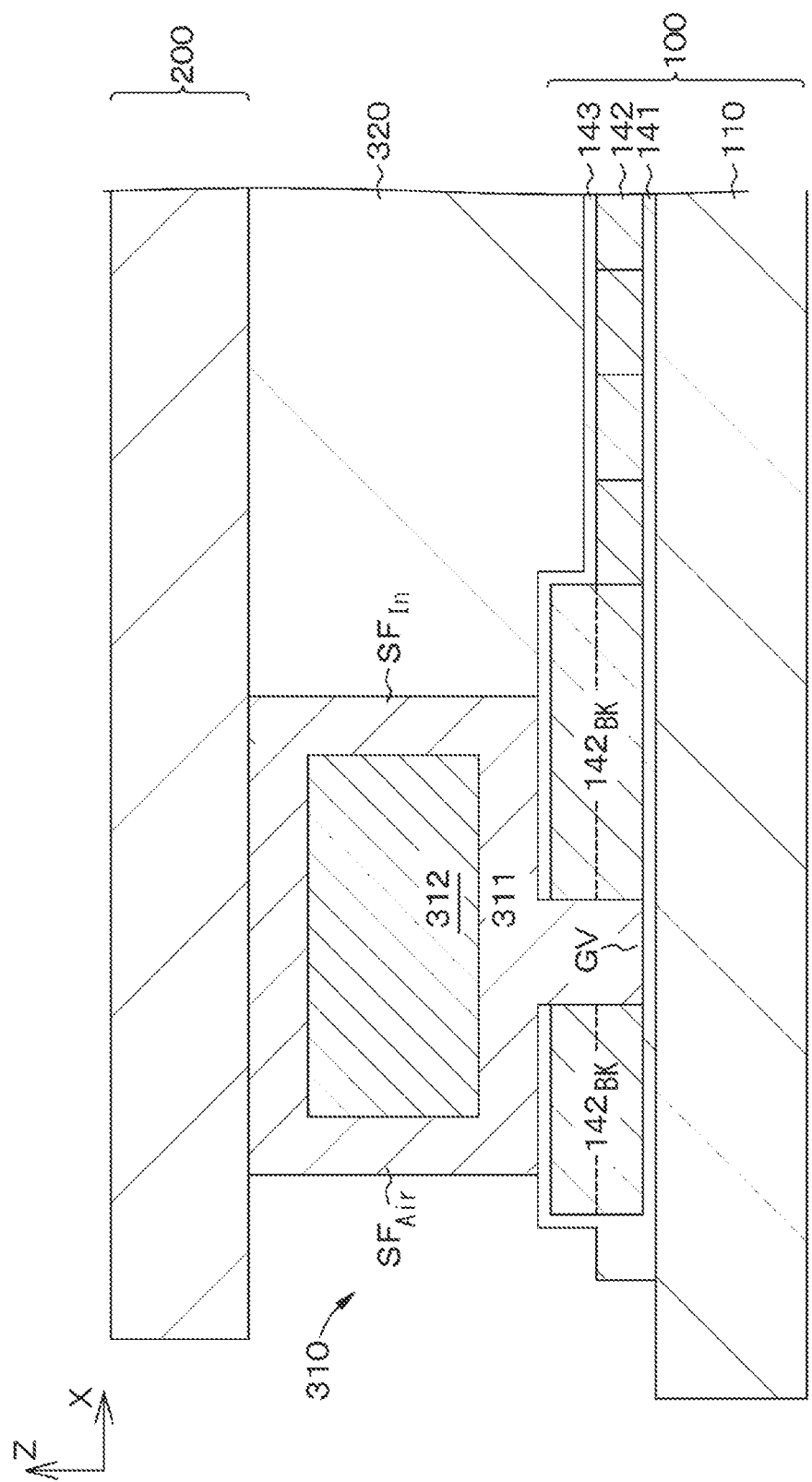
FIG. 17 is a schematic partial cross-sectional view for explaining a sealed state of the first substrate and the second substrate according to a third modification.

FIG. 17 is a schematic partial cross-sectional view for explaining a sealed state of the first substrate and the second substrate according to a third modification.

In this example, the first substrate 100 includes a light shielding unit $142_{BK}$ that includes the stacked color filters 142 and is formed so as to surround the periphery of the display area. The light shielding unit $142_{BK}$ includes a stack of filters for two different colors (for example, a red filter and a green filter, a green filter and a blue filter, or a red filter and a blue filter).

Then, a part of the light shielding unit $142_{BK}$ overlapping the seal portion 310 is removed in a groove shape along the seal portion 310. A reference sign GV denotes a region from which the light shielding unit $142_{BK}$ is removed. The covering member 311 is buried in the groove-shaped region GV.

In general, a material forming a color filter has high moisture permeability. Thus, if the first substrate 100 and the second substrate 200 are sealed without provision of the groove-shaped region GV, water vapor or the like is likely to enter to the inside from the outside of the display device 1 through the color filters. By forming a configuration in which the covering member 311 is buried in the region GV where the light shielding unit is removed in a groove shape, it is possible to keep the moisture permeability low.

Figure 18:
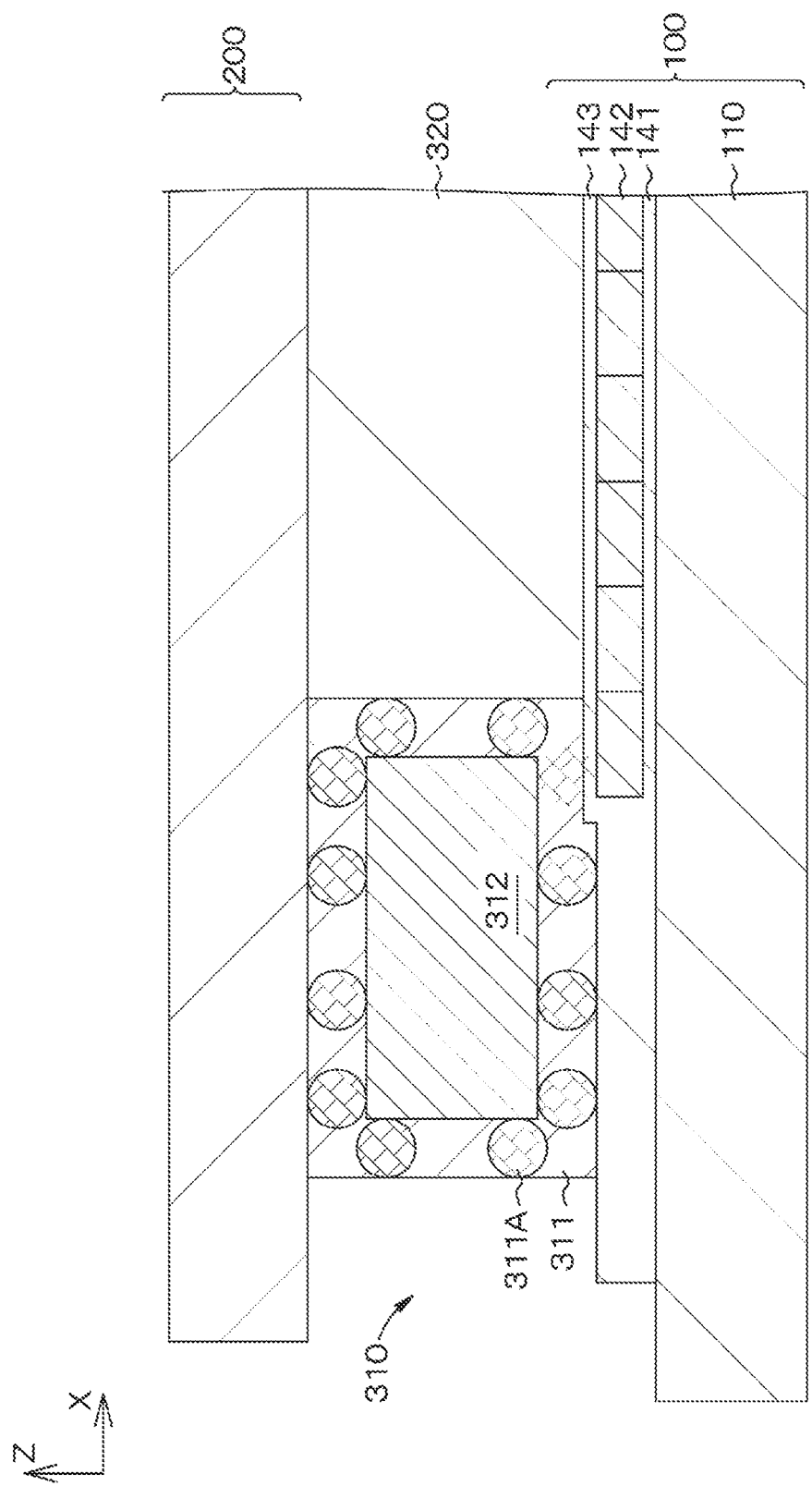
FIG. 18 is a schematic partial cross-sectional view for explaining a sealed state of the first substrate and the second substrate according to a fourth modification.

FIG. 18 is a schematic partial cross-sectional view for explaining a sealed state of the first substrate and the second substrate according to a fourth modification.

In this example, the covering member 311 includes a sealing material containing a spacer 311A. As the spacer 311A, an example in which a spherical body (microbead) formed of an inorganic insulator such as silica, for example, is used is illustrated. Mixing the spacer enables adjustment of the viscosity and strength of the sealing material and can keep the thickness of the covering member 311 in the seal portion substantially constant.

Hereinabove, the embodiments of the present disclosure have been specifically described. However, the present disclosure is not limited to the above-described embodiments and various modifications based on the technical idea of the present disclosure are possible. For example, the numerical values, the configurations, the substrates, the raw materials, the processes, and the like in the above-described embodiments are mere examples, and numerical values, configurations, substrates, raw materials, processes, and the like different from those may be used as necessary.

Description of Electronic Apparatus and Others

The above-described display device of the present disclosure can be used as a display unit (display device) of an electronic apparatus in any field that displays a video signal input to the electronic apparatus or a video signal generated in the electronic apparatus as an image or a video. For example, it can be used as a display unit of a television set, a digital still camera, a notebook personal computer, a mobile terminal device such as a mobile phone, a video camera, a head-mounted display, or the like.

The display device of the present disclosure further includes a module having a sealed configuration. Additionally, the display module may be provided with a circuit for inputting and outputting a signal and the like from the outside to the display area, a flexible printed circuit (FPC), and the like. Below, a digital still camera and a head-mounted display will be described as specific examples of an electronic apparatus using the display device of the present disclosure. However, the specific examples described below are mere examples, and the electronic apparatus using the display device of the present disclosure is not limited thereto.

First Specific Example

Figure 19A:
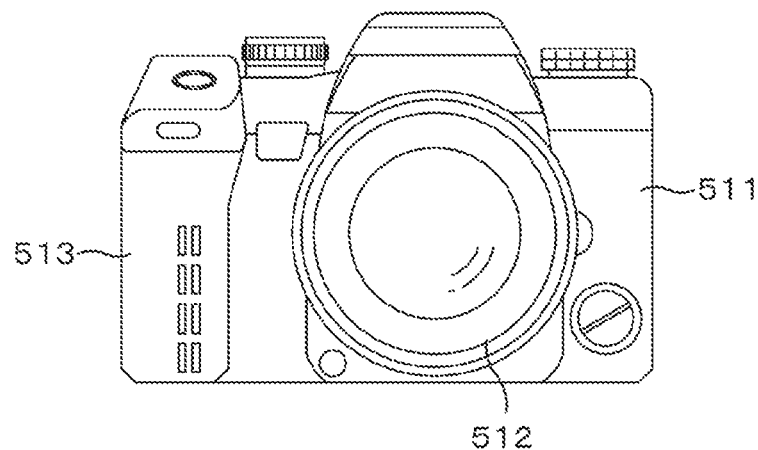
FIG. 19 is an external view of a single-lens reflex digital still camera with an interchangeable lens, including FIG. 19A illustrating a front view thereof and FIG. 19B illustrating a back view thereof.
Figure 19B:
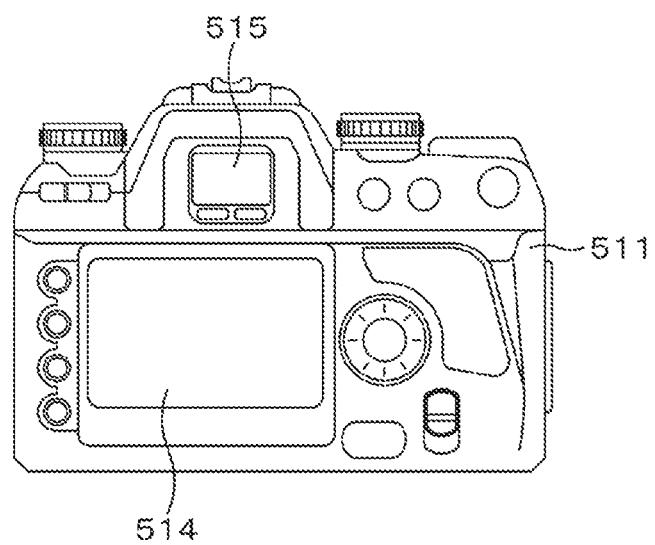

FIG. 19 is an external view of a single-lens reflex digital still camera with an interchangeable lens, including FIG. 19A illustrating a front view thereof and FIG. 19B illustrating a back view thereof. The single-lens reflex digital still camera with an interchangeable lens includes, for example, an interchangeable photographing lens unit (interchangeable lens) 512 at the right front of a camera body 511 and a grip portion 513 to be gripped by a photographer, at the left front of the camera body 511.

Further, a monitor 514 is provided at the substantial center of the back surface of the camera body 511. A viewfinder (eyepiece window) 515 is provided above the monitor 514. A photographer can visually recognize an optical image of a subject guided from the photographing lens unit 512 and determine the composition by looking into the viewfinder 515.

In the single-lens reflex digital still camera with an interchangeable lens having the above configuration, the display device of the present disclosure can be used as the viewfinder 515. In other words, the single-lens reflex digital still camera with an interchangeable lens according to this example is manufactured by using the display device of the present disclosure as the viewfinder 515 thereof.

Second Specific Example

Figure 20:
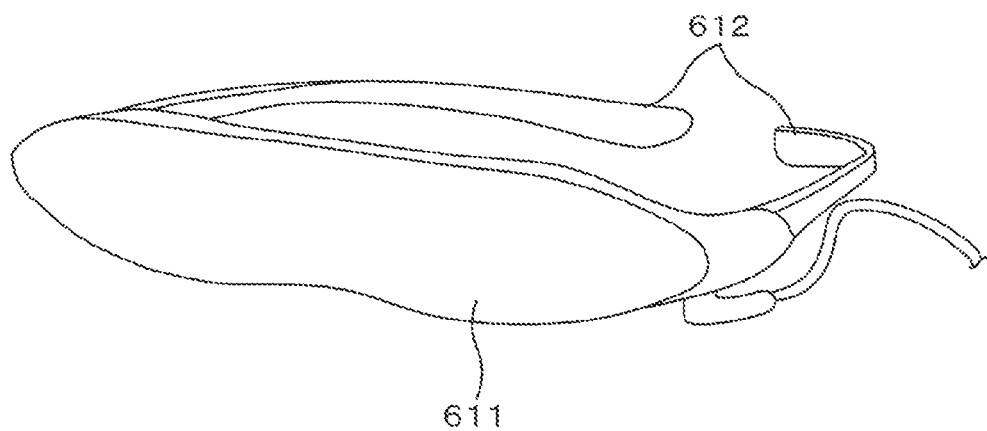
FIG. 20 is an external view of a head-mounted display.

FIG. 20 is an external view of a head-mounted display. The head-mounted display includes, for example, ear hooking portions 612 to be worn on a user's head on both sides of a spectacles-shaped display unit 611. In the head-mounted display, the display device of the present disclosure can be used as the display unit 611. In other words, the head-mounted display according to this example is manufactured by using the display device of the present disclosure as the display unit 611.

Third Specific Example

Figure 21:
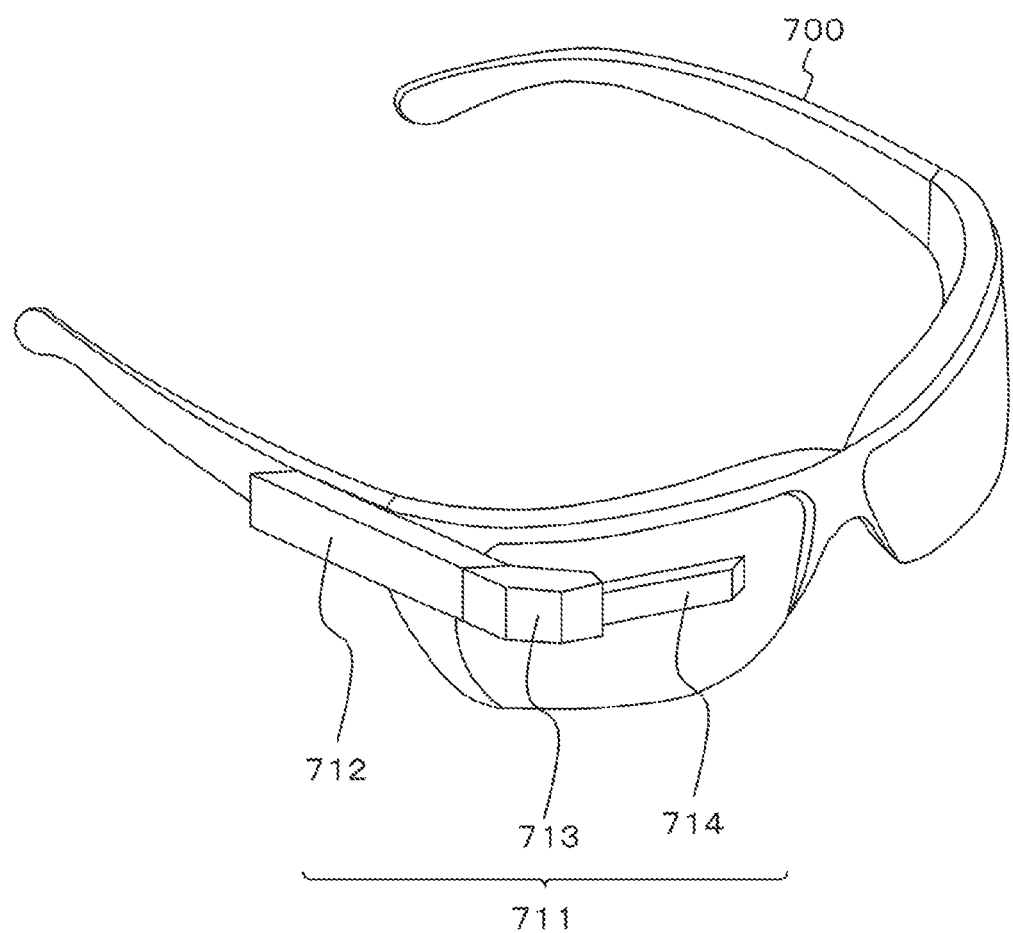
FIG. 21 is an external view of a see-through head-mounted display.

FIG. 21 is an external view of a see-through head-mounted display. A see-through head-mounted display 711 includes a main body 712, an arm 713, and a lens barrel 714.

The main body 712 is connected to the arm 713 and spectacles 700. More specifically, the lengthwise end of the main body 712 is connected to the arm 713, and one of the side surfaces of the main body 712 is connected to the spectacles 700 via a connecting member. Additionally, the main body 712 may be mounted directly on a head of a human body.

The main body 712 incorporates a control board for controlling operations of the see-through head-mounted display 711, and a display unit. The arm 713 connects the main body 712 and the lens barrel 714 and supports the lens barrel 714. Specifically, the arm 713 is connected to the end of the main body 712 and the end of the lens barrel 714, and fixes the lens barrel 714. Furthermore, the arm 713 incorporates a signal line for communicating data related to an image provided from the main body 712 to the lens barrel 714.

The lens barrel 714 projects image light provided from the main body 712 via the arm 713, toward eyes of a user wearing the see-through head-mounted display 711 through the eyepiece. In the see-through head-mounted display 711, the display device of the present disclosure can be used as the display unit of the main body 712.

Additionally, the effects described in the present specification are mere examples and are not limited, and other effects may be produced.

Moreover, the technique of the present disclosure can also have the following configurations.

[A1]
A display device comprising:
a first substrate including a display area including display elements arranged in a matrix;
a second substrate including a transparent material; and
a seal portion placed so as to surround a periphery of the display area, wherein
the seal portion includes a core including a light shielding material and a covering member including a sealing material, and
the first substrate and the second substrate are sealed while a surface of the covering member in the seal portion serves as a contact surface.

[A2]
The display device according to the above [A1], wherein among surfaces of the seal portion except the contact surface, at least one of a side surface facing outward and a side surface facing inward with respect to the display device is covered with the covering member.

[A3]
The display device according to the above [A2], wherein among the surfaces of the seal portion, both of the side surface facing outward and the side surface facing inward with respect to the display device are covered with the covering member.

[A4]
The display device according to any of the above [A1] to [A3], wherein
at least one of the first substrate and the second substrate includes a light shielding unit that includes stacked color filters and is formed so as to surround the periphery of the display area, and
a part of the light shielding unit overlapping the seal portion is removed in a groove shape along the seal portion.

[A5]
The display device according to the above [A4], wherein the covering member is buried in a region where the light shielding unit is removed in a groove shape.

[A6]
The display device according to any of the above [A1] to [A5], wherein
the covering member includes a sealing material using a resin.

[A7]
The display device according to the above [A6], wherein the covering member includes a thermosetting resin or a photocurable resin.

[A8]
The display device according to the above [A7], wherein the covering member includes an acrylic resin and a urethane resin, or a resin formed of a mixture of the resins.

[A9]
The display device according to any of the above [A1] to [A5], wherein
the covering member includes a sealing material using low-melting-point glass.

[A10]
The display device according to any of the above [A1] to [A9], wherein
the covering member includes a sealing material containing a spacer.

[A11]
The display device according to any of the above [A1] to [A10], wherein
the core includes a light shielding material using a black resin.

[A12]
The display device according to the above [A11], wherein the core includes a thermosetting or photocurable polyimide resin mixed with at least one of a black pigment, carbon black, and titanium black.

[A13]
The display device according to any of the above [A1] to [A12], wherein
the display element includes a light emitting unit including an organic electroluminescence element.

[B1]
An electronic apparatus comprising a display device, wherein the display device includes:
a first substrate including a display area including display elements arranged in a matrix;
a second substrate including a transparent material; and
a seal portion placed so as to surround a periphery of the display area, the seal portion includes a core including a light shielding material and a covering member including a sealing material, and the first substrate and the second substrate are sealed while a surface of the covering member in the seal portion serves as a contact surface.

[B2]

The display device according to the above [B1], wherein among surfaces of the seal portion except the contact surface, at least one of a side surface facing outward and a side surface facing inward with respect to the display device is covered with the covering member.

[B3]

The electronic apparatus according to the above [B2], wherein among the surfaces of the seal portion except the contact surface, both of the side surface facing outward and the side surface facing inward with respect to the display device are covered with the covering member.

[B4]

The electronic apparatus according to any of the above [B1] to [B3], wherein at least one of the first substrate and the second substrate includes a light shielding unit that includes stacked color filters and is formed so as to surround a periphery of the display area, and a part of the light shielding unit overlapping the seal portion is removed in a groove shape along the seal portion.

[B5]

The electronic apparatus according to the above [B4], wherein the covering member is buried in a region where the light shielding unit is removed in a groove shape.

[B6]

The electronic apparatus according to any of the above [B1] to [B5], wherein the covering member includes a sealing material using a resin.

[B7]

The electronic apparatus according to the above [B6], wherein the covering member includes a thermosetting resin or a photocurable resin.

[B8]

The electronic apparatus according to the above [B7], wherein the covering member includes an acrylic resin and a urethane resin, or a resin formed of a mixture of the resins.

[B9]

The electronic apparatus according to any of the above [B1] to [B5], wherein the covering member includes a sealing material using low-melting-point glass.

[B10]

The electronic apparatus according to any of the above [B1] to [B9], wherein the covering member includes a sealing material containing a spacer.

[B11]

The electronic apparatus according to any of the above [B1] to [B10], wherein the core includes a light shielding material using a black resin.

[B12]

The electronic apparatus according to the above [B11], wherein the core includes a thermosetting or photocurable polyimide resin mixed with at least one of a black pigment, carbon black, and titanium black.

[B13]

The electronic apparatus according to any of the above [B1] to [B12], wherein the display element includes a light emitting unit including an organic electroluminescence element.

REFERENCE SIGNS LIST

1 DISPLAY DEVICE
10 DISPLAY ELEMENT
11 DISPLAY AREA
21 POWER SUPPLY UNIT
22 SCANNING UNIT
23 DATA DRIVER
100 FIRST SUBSTRATE
110 SUPPORT
122 GATE ELECTRODE
123 GATE INSULATING FILM
124 SEMICONDUCTOR MATERIAL LAYER
125 INTERLAYER INSULATING FILM
126 SOURCE/DRAIN ELECTRODE
127 FLATTENING FILM
131 ANODE ELECTRODE
132 PARTITION WALL
133 ORGANIC LAYER
134 CATHODE ELECTRODE
141 PROTECTIVE FILM
142 COLOR FILTER
143 PROTECTIVE FILM
200 SECOND SUBSTRATE
310 SEAL PORTION
311, $311_B$, $311_T$ COVERING MEMBER
311A SPACER
312 CORE
400 COAXIAL STRUCTURE NOZZLE
401 OUTER NOZZLE
402 INNER NOZZLE
410 NOZZLE ASSEMBLY
411 OUTER NOZZLE
412 INNER NOZZLE
511 CAMERA BODY
512 PHOTOGRAPHING LENS UNIT
513 GRIP PORTION
514 MONITOR
515 VIEWFINDER
611 SPECTACLES-SHAPED DISPLAY UNIT
612 EAR HOOKING PORTION
700 SPECTACLES
711 SEE-THROUGH HEAD-MOUNTED DISPLAY
712 MAIN BODY
713 ARM
714 LENS BARREL
SCL SCANNING LINE
DTL DATA LINE
PS1 FIRST FEEDER LINE
PS2 COMMON FEEDER LINE
$TR_{WS}$ WRITE TRANSISTOR
$TR_D$ DRIVE TRANSISTOR
$C_S$ CAPACITOR
ELP LIGHT EMITTING UNIT
$C_{EL}$ CAPACITANCE OF LIGHT EMITTING UNIT ELP

SF$_{Air}$ SIDE SURFACE FACING OUTWARD WITH RESPECT TO DISPLAY DEVICE IN SEAL PORTION

SF$_{In}$ SIDE SURFACE FACING INWARD WITH RESPECT TO DISPLAY DEVICE IN SEAL PORTION

The invention claimed is:

1. A display device comprising:
a first substrate including a display area including display elements arranged in a matrix, the first substrate including a support layer;
a second substrate including a transparent material; and
a seal portion placed so as to surround a periphery of the display area, wherein
the seal portion includes a core including a light shielding material and a covering member including a sealing material, and
the first substrate and the second substrate are sealed while a surface of the covering member in the seal portion serves as a contact surface;
a light shielding portion formed above the support layer in a first direction, the light shielding portion being formed so as to surround the periphery of the display area; and
stacked color filters arranged along a second direction extending from the light shielding portion, the second direction being perpendicular to the first direction, wherein
a part of the light shielding portion overlapping the seal portion is removed in a groove shape along the seal portion.

2. The display device according to claim 1, wherein among surfaces of the seal portion except the contact surface, at least one of a side surface facing outward and a side surface facing inward with respect to the display device is covered with the covering member.

3. The display device according to claim 2, wherein among the surfaces of the seal portion except the contact surface, both of the side surface facing outward and the side surface facing inward with respect to the display device are covered with the covering member.

4. The display device according to claim 1, wherein the covering member is buried in a region where the light shielding portion is removed in a groove shape.

5. The display device according to claim 1, wherein the covering member includes a sealing material using a resin.

6. The display device according to claim 5, wherein the covering member includes a thermosetting resin or a photocurable resin.

7. The display device according to claim 6, wherein the covering member includes an acrylic resin and a urethane resin, or a resin formed of a mixture of the resins.

8. The display device according to claim 1, wherein the covering member includes a sealing material using low-melting-point glass.

9. The display device according to claim 1, wherein the covering member includes a sealing material containing a spacer.

10. The display device according to claim 1, wherein the core includes a light shielding material using a black resin.

11. The display device according to claim 10, wherein the core includes a thermosetting or photocurable polyimide resin mixed with at least one of a black pigment, carbon black, and titanium black.

12. The display device according to claim 1, wherein the display elements respectively include light emitting units that include an organic electroluminescence element.

13. An electronic apparatus comprising a display device according to claim 1.

14. The electronic apparatus according to claim 13, wherein among surfaces of the seal portion except the contact surface, at least one of a side surface facing outward and a side surface facing inward with respect to the display device is covered with the covering member.

15. The electronic apparatus according to claim 14, wherein among the surfaces of the seal portion except the contact surface, both of the side surface facing outward and the side surface facing inward with respect to the display device are covered with the covering member.

16. The electronic apparatus according to claim 13, wherein the covering member is buried in a region where the light shielding portion is removed in a groove shape.

17. The electronic apparatus according to claim 13, wherein the covering member includes a sealing material using a resin.

18. The electronic apparatus according to claim 17, wherein the covering member includes a thermosetting resin or a photocurable resin.

19. The electronic apparatus according to claim 18, wherein the covering member includes an acrylic resin and a urethane resin, or a resin formed of a mixture of the resins.

20. The electronic apparatus according to claim 13, wherein the covering member includes a sealing material using low-melting-point glass.

* * * * *